US010263643B2

(12) United States Patent
Li

(10) Patent No.: US 10,263,643 B2
(45) Date of Patent: Apr. 16, 2019

(54) METHOD AND SYSTEM OF MULTI-FOLD DATA PROTECTION FOR HIGH-DENSITY STORAGE APPLIANCE WITH IMPROVED AVAILABILITY AND ROBUSTNESS

(71) Applicant: Alibaba Group Holding Limited, George Town (KY)

(72) Inventor: Shu Li, Bothell, WA (US)

(73) Assignee: Alibaba Group Holding Limited (KY)

( * ) Notice: Subject to any disclaimer, the term of this patent is extended or adjusted under 35 U.S.C. 154(b) by 71 days.

(21) Appl. No.: 15/479,605

(22) Filed: Apr. 5, 2017

(65) Prior Publication Data
US 2018/0294823 A1    Oct. 11, 2018

(51) Int. Cl.
*H03M 13/29*    (2006.01)
*G06F 11/10*    (2006.01)

(52) U.S. Cl.
CPC ..... *H03M 13/2906* (2013.01); *G06F 11/1076* (2013.01)

(58) Field of Classification Search
CPC ................. H03M 13/2906; G06F 11/1076
See application file for complete search history.

(56) References Cited

U.S. PATENT DOCUMENTS

| | | | |
|---|---|---|---|
| 5,305,227 A | 4/1994 | Sasaki | |
| 8,429,514 B1 * | 4/2013 | Goel | G06F 12/00 714/758 |
| 9,300,329 B2 | 3/2016 | Kumar | |
| 2005/0114727 A1 * | 5/2005 | Corbett | G06F 11/1076 714/6.21 |
| 2008/0250270 A1 * | 10/2008 | Bennett | G06F 11/1068 714/6.13 |
| 2010/0299576 A1 * | 11/2010 | Baysah | G06F 11/1044 714/763 |
| 2017/0255512 A1 * | 9/2017 | Zamir | G06F 11/1068 |
| 2017/0255517 A1 * | 9/2017 | Achtenberg | G06F 3/0619 |
| 2017/0255518 A1 * | 9/2017 | Achtenberg | G06F 3/0619 |

OTHER PUBLICATIONS

Author Unknown, Non-Standard RAID Levels, Wikipedia, Jan. 3, 2017, https://en.wikipedia.org/w/index.php?title=Non-standard_RAID_levels&oldid=758134001.

Author Unknown, Standard RAID Levels, Wikipedia, Mar. 10, 2017, https://en.wikipedia.org/w/index.php?title=Standard_RAID_levels&oldid=769583230.

* cited by examiner

*Primary Examiner* — Kyle Vallecillo
(74) *Attorney, Agent, or Firm* — Van Pelt, Yi & James LLP

(57) ABSTRACT

A first set of data is encoded using a first code to obtain a first-code codeword which includes the first set of data and first-code parity information. The first set of data is stored on a plurality of drives, wherein the first set of data is distributed amongst the plurality of drives. A second set of data is encoded using a second code to obtain a second-code codeword which includes the second set of data and second-code parity information. The second-code codeword is stored on the plurality of drives, wherein the second set of data and second-code parity information are distributed amongst the plurality of drives.

21 Claims, 22 Drawing Sheets

| 1st Drive | 2nd Drive | 3rd Drive | 4th Drive | 5th Drive | 6th Drive | 7th Drive | 8th Drive |

☐ Data  ▦ Parity (1st Code)  ▨ Parity (2nd Code)

Combines with Data    Combines with Zero Pad

Combines with Parity    Combines with Combined Data & Parity

METHOD AND SYSTEM OF MULTI-FOLD DATA PROTECTION FOR HIGH-DENSITY STORAGE APPLIANCE WITH IMPROVED AVAILABILITY AND ROBUSTNESS

BACKGROUND OF THE INVENTION

With storage systems, one performance metric of interest is the system's ability to tolerate a failure, for example in a drive and/or blocks on a drive. Some types of storage systems are not (as an example) able to recover all of the stored data if two drives and one or more blocks on a third drive fail. New storage systems and/or techniques which are able to recover from this scenario (or, to put it more generally, improve the failure tolerance of existing storage systems) would be desirable. Furthermore, it would also be desirable if some configurations or embodiments of the new storage systems and/or techniques also improved the storage capacity (e.g., by fitting more data into the same amount of raw storage).

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a data protection system are described herein. First, some embodiments of the write process (which includes encoding) are described. Then, some embodiments of the read write process (which includes decoding, if needed) are described. Lastly, some embodiments which further improve the capacity of the data protection system by superimposing data onto parity information are described.

Figure 1:
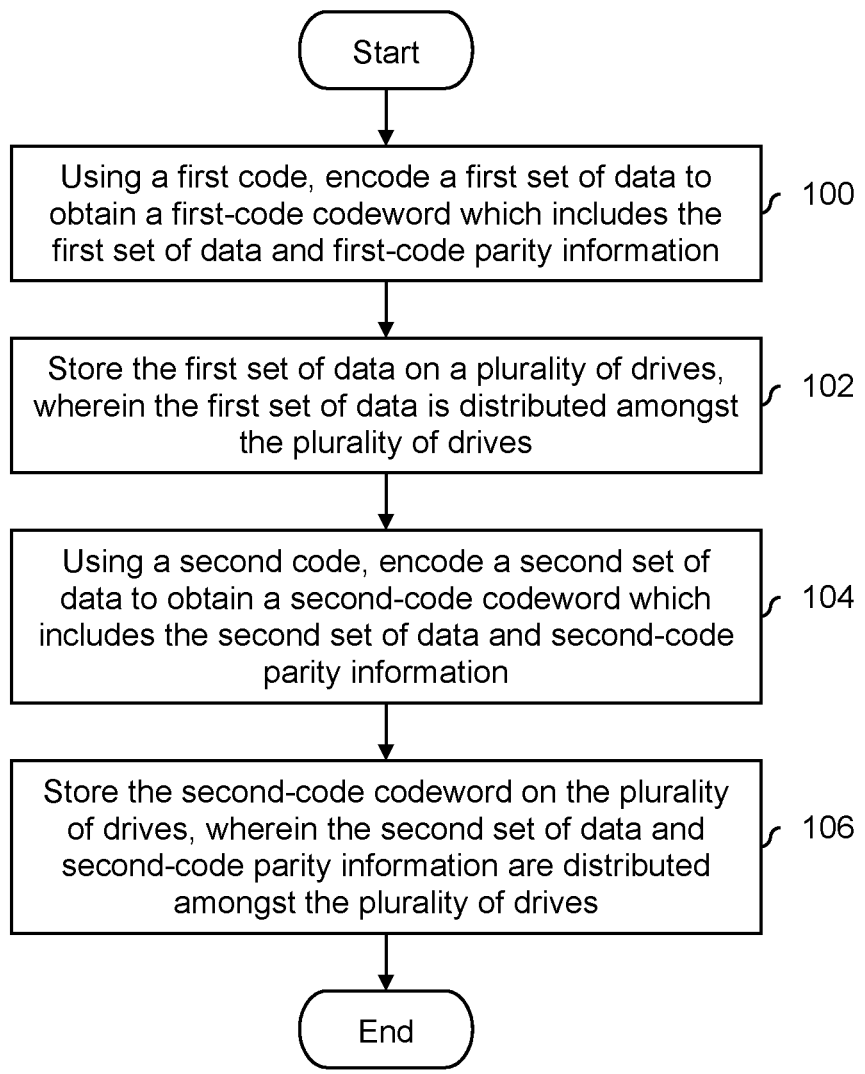
FIG. 1 is a flowchart illustrating an embodiment of a write process associated with a multi-fold data protection system.

FIG. 1 is a flowchart illustrating an embodiment of a write process associated with a multi-fold data protection system. In the example shown, the process is performed in a storage system with multiple drives (e.g., in a high-capacity storage cluster). In some embodiments, the process shown here is performed by some controller which manages those drives (e.g., one of the drives acts as a master drive or there is a non-storage device which only performs management processes).

At 100, using a first code, a first set of data is encoded to obtain a first-code codeword which includes the first set of data and first-code parity information. Generally speaking, the codeword is the output of the encoding process, and the codeword depends upon the information being protected (in this case, the first set of data) and the code used (in this case, the first code). In examples described herein, systematic codes are used which generate codewords which include the information being protected followed by some parity information. The techniques described herein also work with non-systematic codes (and therefore in some embodiments non-systematic codes are used), so long as the code is a linear blocks code. In one example described below, the first code has a code rate of k/n=5/7 where k=5 is the amount of protected information input to the encoder and n−k=2 is the amount of redundant (e.g., parity) information output by the encoder. In other words, for every two blocks of data being protected, two blocks of parity is output by the exemplary first code described below. In some embodiments, a Reed-Solomon code is used for the first code. Other types of codes can be used.

In one example of step 100, there are multiple data sets: A-G. Step 100 is repeated so that each of the data sets (e.g., the A set, the B set, etc.) is encoded to obtain corresponding first-code parity information for each set of data.

At 102, the first set of data is stored on a plurality of drives, wherein the first set of data is distributed amongst the plurality of drives. For example, suppose the A set of data includes data A1-A5. A1 may be stored on a first drive, A2 may be stored on a second drive, and so on. It is noted that some other systems may store data from the same set of data on the same drive (e.g., all of A1-A5 stored on the same drive) which is less desirable because it creates a single point of failure and may make data recovery more difficult or even impossible.

In some embodiments, the first-code parity information is also stored on one or more of the drives (i.e., the entire first-code codeword, which includes the first set of data and first-code parity information, is stored). Alternatively, in some embodiments, the first-code parity information is not stored (e.g., to increase storage capacity). Some examples of this are described in more detail below.

At 104, using a second code, a second set of data is encoded to obtain a second-code codeword which includes the second set of data and second-code parity information. For example, the second code may have a different code rate (i.e., inputs a different number of data blocks and/or outputs a different number of parity blocks) than the first code. In one example described below, the second set of data includes the data blocks A1, B1, C1, D1, E1, and F1 which is encoded using the second code. This set of data is merely exemplary and is not intended to be limiting. For example, the indices do not need to match and another example of step 104 is to encode A5, B2, C4, D3, E5, and F1 (e.g., where the indices do not match). In some embodiments, the first code and second code are the same type of code, but with different code rates.

In some embodiments, step 104 is repeated for different groups of data. For example, as will be described in more detail below, each instance of step 104 may correspond to encoding one row of horizontal data and step 104 may be repeated as desired.

At 106, the second-code codeword is stored on the plurality of drives, wherein the second set of data and second-code parity information are distributed amongst the plurality of drives. In one example, a plurality of drives includes data-only drives only storing data and parity-only drives only storing parity information, and the second-code parity information is stored on one or more of the parity-only drives. Alternatively, data and parity may be stored together.

In some embodiments, the first code is diagonal code where the protected data is spread out over different drives. In some embodiments, the second code is a row code which is independent of the first code and third code. In some embodiments, the third code is a nested code of the first code. For example, as will be described in more detail below, the parity check matrix of the third code is a sub-matrix of the first code's parity check matrix. As a result of this relationship between the parity check matrices of the first code and the third code, the first code is stronger (i.e., capable of correcting more errors) than the third code. The first code and the second code are at different dimensions to form the joint protection.

To better understand the process of FIG. 1, it may be helpful to consider an example multi-fold data protection system with some example data and parity information. The following figure shows one such example.

Figure 2:
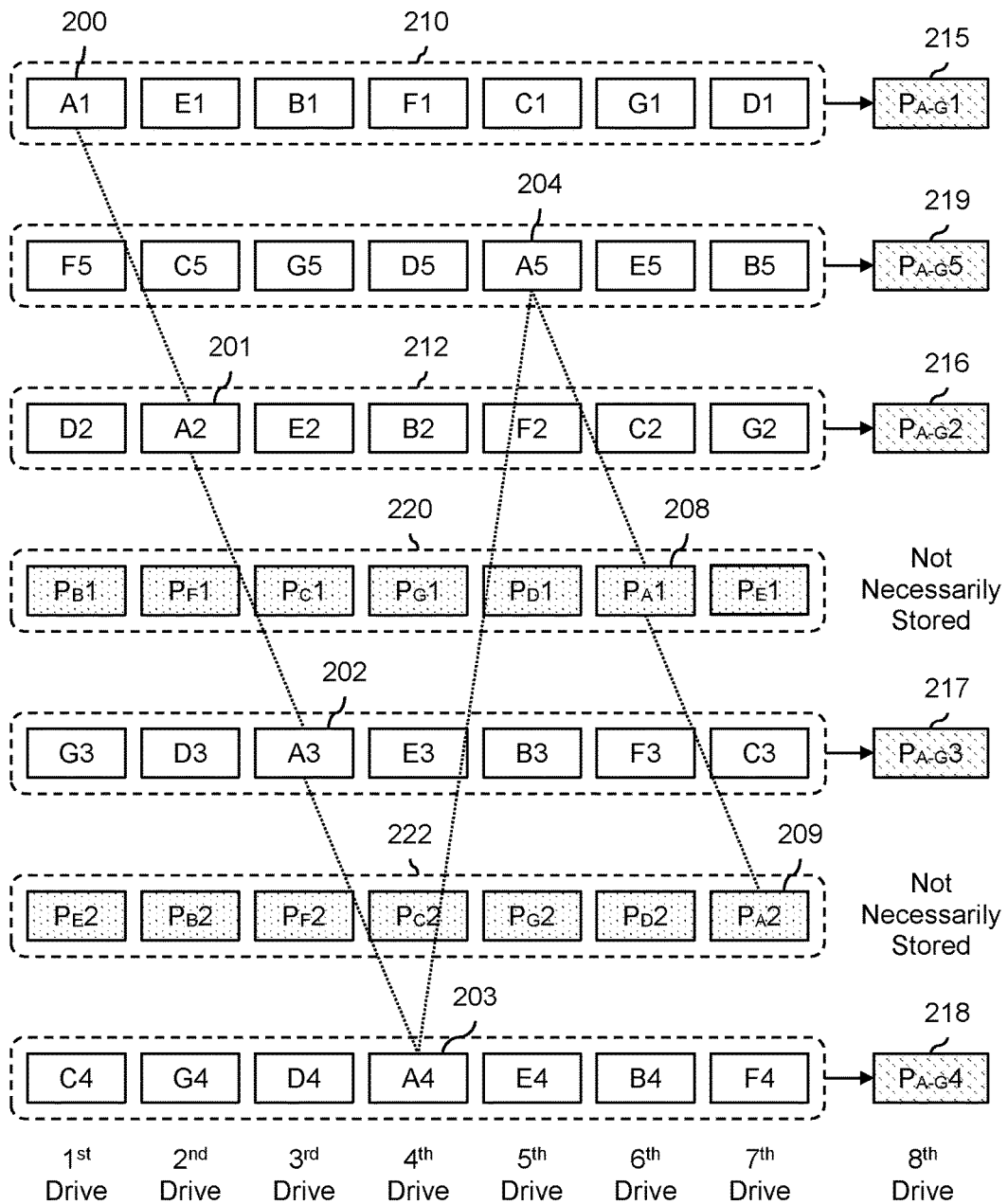
FIG. 2 is a diagram illustrating an embodiment of data which has diagonal encoding using a first code and row encoding using a second code.

FIG. 2 is a diagram illustrating an embodiment of data which has diagonal encoding using a first code and row encoding using a second code. In this example, blocks that begin with a letter in the range of A-G (inclusive) comprise data that is to be encoded and stored. Blocks of data with the same letter are in the same set of data. For example, data A1-A5 comprises an A set of data, data B1-B5 comprises a B set of data, and so on.

Each letter set of data (e.g., the A set of data, the B set of data, etc.) is (e.g., error correction or error detection) encoded using a first code. In this example, the first code has a code rate which produces two parity blocks from five data blocks. For example, when encoding is performed on the A set of data, a first-code codeword comprising data A1-A5 (200-204), parity $P_A1$ (208) and $P_A2$ (209) is produced (e.g., see the blocks connected by dotted lines). Blocks which begin with a "P" are parity blocks and the subscript indicates the corresponding information being protected. In some embodiments, the first code is a Reed-Solomon code. For convenience, this encoding using the first code is sometimes referred to as diagonal encoding because data laid out on a grid are encoded along diagonal lines, as shown in the example layout. This encoding is one example of the encoding performed at step 100 in FIG. 1.

In this example, each column corresponds to a different drive: the leftmost column corresponds to a first drive, the second-from-left column corresponds to a second drive, and so on. To reduce exposure to drive failure, data in a given set is spread out over different drives. For example, data A1 (200) is stored on a first drive, data A2 (201) is stored on a second drive, data A3 (202) is stored on a third drive, data A4 (203) is stored on a fourth drive, and data A5 (201) is stored on a fifth drive. This is one example of step 102 in FIG. 1. This way, if one of the drives fails, only one piece of data is lost. In contrast, if data A1-A5 were stored on the same drive and that drive failed, then the entire A set of data would be lost. In various embodiments, the drives may be a hard disk drive (HDD), a solid state drive (SSD), or any other appropriate storage devices.

It is noted that some other systems may store all of the data in a given set of data on the same drive instead of spreading them out over different drives as shown here. For example, some other systems may store all of A1-A5 on the same drive. This may be less desirable than the example arrangement shown here (or, more generally, the process of FIG. 1) because if the drive fails then all of A1-A5 (and possibly $P_A1$, and $P_A2$ as well if they are also stored on that drive) will be lost and it may be more difficult to recover the data. To put it another way, the example arrangement shown here (or, more generally, the process of FIG. 1) is more robust compared to some other data protection systems.

Encoding is also performed on the data in the horizontal direction (i.e., a row). For example, performing encoding on the data in row 210 (using the second code) produces a second-code codeword which includes the data in row 210 (i.e., A1, E1, B1, F1, C1, G1, and D1) and the second-parity $P_{A-G}1$ (215). In this example, the second (i.e., row) code has a code rate which produces one block of parity information from seven blocks of data. This row encoding is one example of step 104 in FIG. 1 and the distributed storage of the second-code codeword over all eight drives is one example of step 106. It is noted that the codes and code rates described herein are merely exemplary and any code (rate) may be used.

It is noted that the rows of first-code parity information (220 and 222) are not necessarily stored. As is described in more detail below, in some embodiments, other information is stored in place of diagonal parity (220 and 222) in order to fit more data (e.g., superimposed data) onto the drives.

The protection provided by error-correction encoding shown here is referred to as multi-fold because there are multiple folds (e.g., layers) of protection. The diagonal encoding is sometimes referred to as block-level data protection and the row encoding is sometimes referred to as drive-level protection. Using one or both levels of protection (e.g., iterating and/or switching back and forth between block-level decoding and drive-level decoding), data can be recovered to some degree. Some decoding embodiments are described below.

The following figure describes a counterpart read process which corresponds to the write process of FIG. 1.

Figure 3:
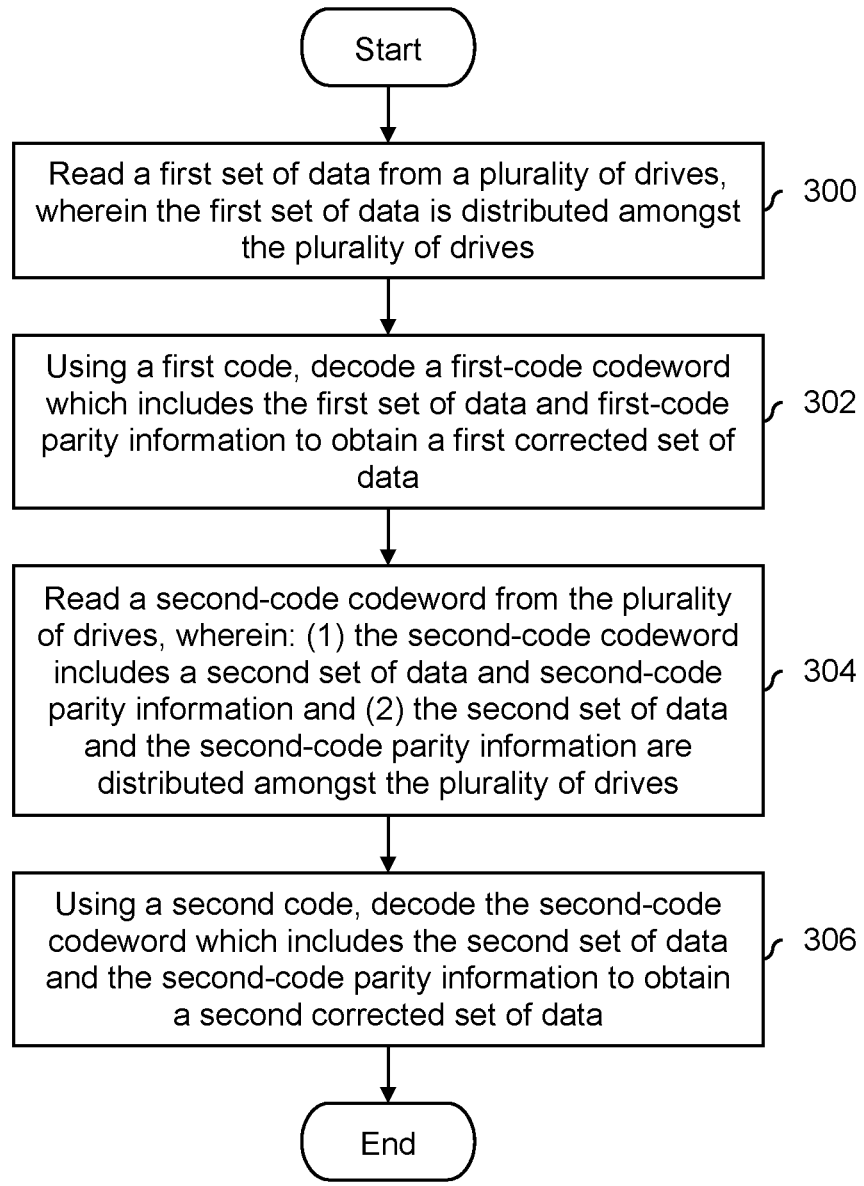
FIG. 3 is a flowchart illustrating an embodiment of a read process associated with a multi-fold data protection system.

FIG. 3 is a flowchart illustrating an embodiment of a read process associated with a multi-fold data protection system. This read and/or decode example corresponds to the write and/or encode example of FIG. 1.

At 300, a first set of data is read from a plurality of drives, wherein the first set of data is distributed amongst the plurality of drives. For example, as will be described below, if the E set of data is going to be decoded, then the data E1-E5 may be read from the various drives that store those pieces or blocks of data. It is noted that reading at step 300 may skip data or parity blocks which are already available or known to the process (e.g., in one example described below, the A1 block is not re-read prior to decoding the A set of data because the A1 block is already available or known).

In some embodiments, first-code parity information (also to be used during decoding) is also distributed amongst and stored on the plurality of drives (i.e., the entire first-code codeword, which includes the first set of data and first-code parity information, is stored). In some such embodiments, the first-code parity information is also read from the plurality of drives so that the first-code parity information can be used during a subsequent decoding step (e.g., at step 302). For example, to decode the E set of data, the parity information $P_E1$ and $P_E2$ may also be read from the appropriate drive(s).

Alternatively, in some embodiments, data is superimposed upon the first-code parity information (e.g., to improve the storage capacity) and the first-code parity information is reconstructed and/or estimated in some manner (i.e., the first-code codeword is not stored in its entirety because the first-code parity information is not stored). For example, instead of reading the parity information $P_E1$ and $P_E2$ from the drives prior to decoding the E set of data, $P_E1$ and $P_E2$ would be reconstructed. An example reconstruction process is described in more detail below.

At 302, using a first code, a first-code codeword which includes the first set of data and first-code parity information is decoded to obtain a first corrected set of data. For example, E1-E5, $P_E1$, and $P_E2$ would be input to an error correction decoder (e.g., configured according to and/or with knowledge of the first code) and the output would be E1-E5, corrected as needed (e.g., assuming the errors in E1-E5, $P_E1$, and $P_E2$ are within the error correction capability of the first code). In a corrected set of data, at least one piece of data has been corrected but it is not necessary for all pieces of data to be corrected (e.g., some pieces of data have no errors when read back and therefore do not need to be corrected).

At 304, a second-code codeword is read from the plurality of drives, wherein: (1) the second-code codeword includes a second set of data and second-code parity information and (2) the second set of data and the second-code parity information are distributed amongst the plurality of drives. For example, as will be described below, the data A1, E1, B1, F1, C1, G1, and D1 may be read (e.g., respectively from a first drive, a second drive, and so on) and the corresponding parity $P_{A-G}1$ may be read (e.g., where parity $P_{A-G}1$ was generated using A1, E1, B1, F1, C1, G1, and D1). As before, reading at step 304 may skip data or parity blocks which are already available or known to the process.

At 306, using a second code, the second-code codeword which includes the second set of data and the second-code parity information is decoded to obtain second corrected set of data. For example, the data A1, E1, B1, F1, C1, G1, and D1 and parity $P_{A-G}1$ would be input to a decoder and the data would be corrected as needed and assuming the contained errors are within the error correction capability of the second code.

Various steps may be repeated as needed. For example, diagonal decoding (using the first code) and row decoding (using the second code) may be alternated to remove errors over multiple passes until no errors remain. This is because performing diagonal decoding may bring the number of errors in the horizontal direction to within the error correction capability of the row code which permits decoding in the horizontal direction (and vice versa).

The following figures describe an example error scenario which is corrected using the process of FIG. 3.

Figure 4A:
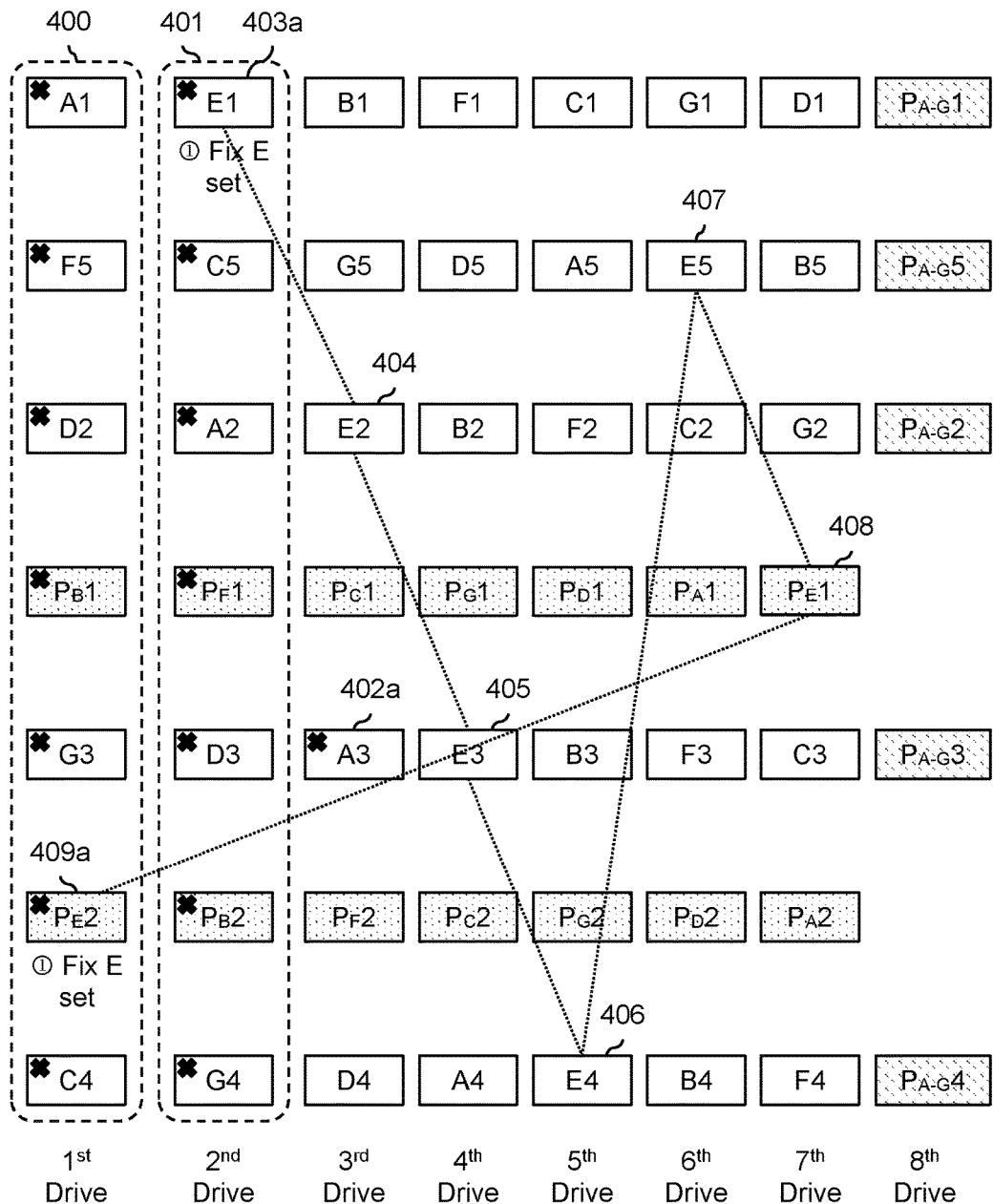
FIG. 4A is a diagram illustrating an embodiment of a first decoding pass.

FIG. 4A is a diagram illustrating an embodiment of a first decoding pass. In the example shown, data and associated parity information are stored across eight drives. The first drive and the second drive in this example have failed and therefore anything stored thereon is unavailable. For this reason, the data and parity information stored on the first drive (400) and the data and parity information stored on the second drive (401) are marked with an "X" in the upper left corner to indicate that there is an error and/or they are unavailable. In addition to the first drive and the second drive, the data A3 (402a) contains an error and as such there is an "X" in the upper left corner.

The error correction capability of the first (e.g., diagonal) code in this example is able to correct up to two blocks with errors (inclusive). For example, up to two blocks with errors in the A set can be corrected, up to two blocks with errors in the B group and be corrected, and so on. The second (e.g., row) code has an error correction capability which is able to correct (at most) a single block with error. In this particular example, the first-code parity information (i.e., $P_A1$, $P_A2$, $P_B2$, $P_B2$, etc.) has been stored but not all embodiments are so configured.

Some other data protection systems would not be able to recover from the error scenario shown here. For example, as described above, other systems may store all of the A data and related parity on the first drive and all of the B data and related parity on the second drive. This would make the A and B data unrecoverable in this error scenario. This is because within the A set of data and related parity there are seven errors (five from the data and two from the parity) which exceeds the first code's maximum of two errors. This holds for the first encoding applied to the B set of data and related parity. Similarly, the second code will not help because there are two or more errors in each row and the second code can fix at most one error per row.

In contrast, because the data sets and associated parity are distributed amongst the drives, the error scenario shown here can be corrected. In this example, the first decoding pass corrects the E set using the first (e.g., diagonal) code (where the E set is selected first so that E1 (403a) can be corrected, subsequently leaving A1 (400) as the only uncorrected block in the top row).

To correct the E set, the E data and associated parity is first obtained and/or read: data E1 (403a) is read from the second drive, data E2 (404) is read from the third drive, data E3 (405) is read from the fourth drive, data E4 (406) is read from the fifth drive, data E5 (407) is read from the sixth drive, parity $P_E1$ (408) is read from the seventh drive, and parity $P_E2$ (409a) is read from the first drive. Since only E1 (403a) and $P_E2$ (409a) contain errors and/or are unavailable, the first (e.g., diagonal) code is able to correct those errors since it is within its error correction capability. The following figure shows the data with those blocks corrected.

Figure 4B:
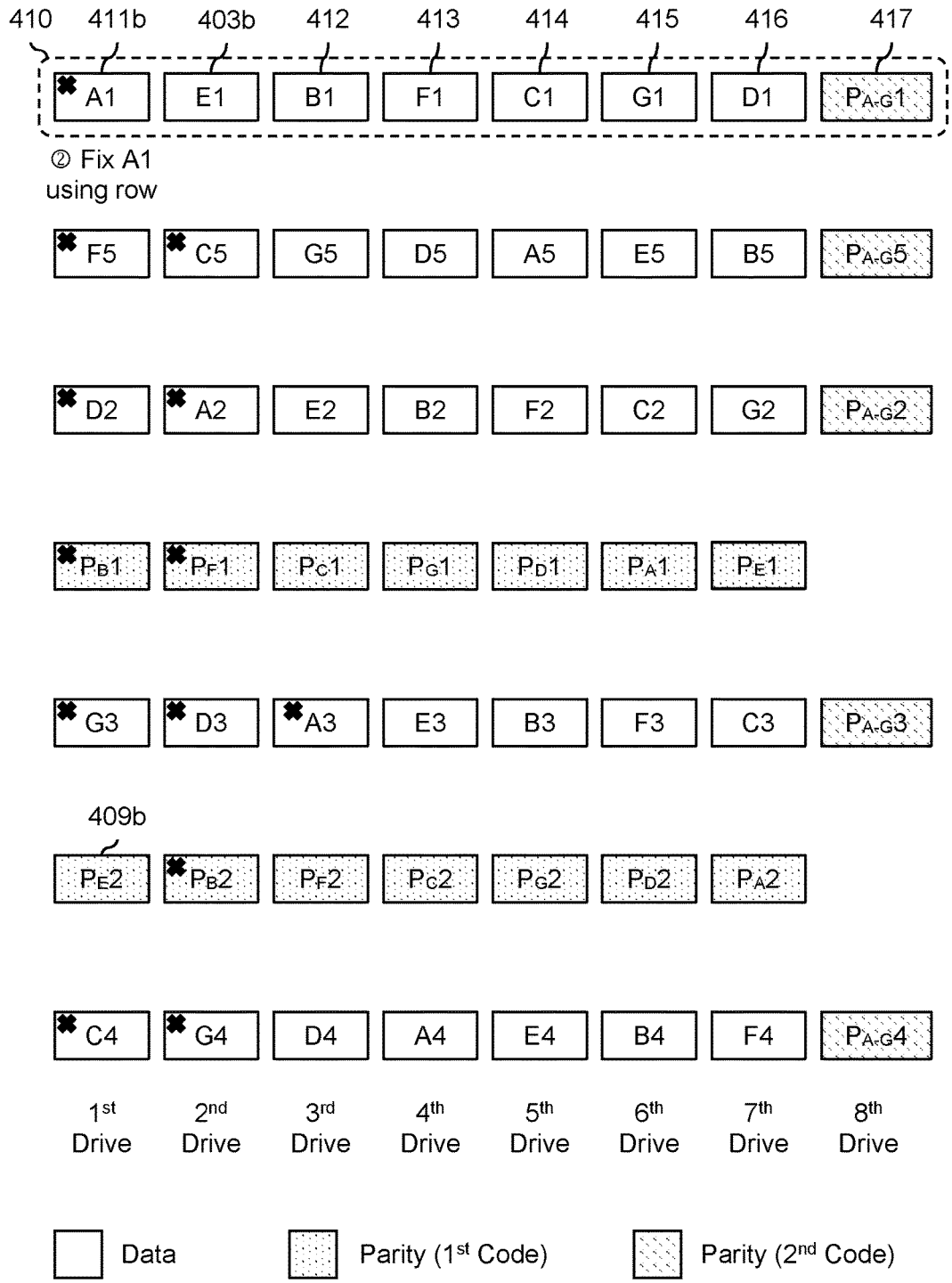
FIG. 4B is a diagram illustrating an embodiment of a second decoding pass.

FIG. 4B is a diagram illustrating an embodiment of a second decoding pass. This figure continues the example of the previous figure. Note, for example, that data E1 (403b) and parity $P_E2$ (409b) have been corrected and no longer have an "X" in their upper left corner. This figure also shows an example of steps 304 and 306 from FIG. 3. For example, reading the data and parity in row 410 is an example of step 304 and performing decoding on that row is an example of step 306.

The decoding pass shown here processes the top row (410) in order to correct A1 (412b). Since A1 is the only erroneous block in the top row, it is within the error correction capability of the second (e.g., row) code. Before decoding is performed, data A1 (411b) is read from the first drive, data E1 (403b) is read from the second drive (note that this read may be skipped because E1 is already available is read from the previous decoding pass), data B1 (412) is read from the third drive, data F1 (413) is read from the fourth drive, data C1 (414) is read from the fifth drive, data G1 (415) is read from the sixth drive, data D1 (416) is read from the seventh drive, and parity $P_{A-G}1$ (417) is read from the eighth drive. Decoding is then performed on the top row (410) to correct A1 (411b).

This decoding pass sets up the next decoding pass, which processes the A set of data and parity. The following figure shows an example of this.

Figure 4C:
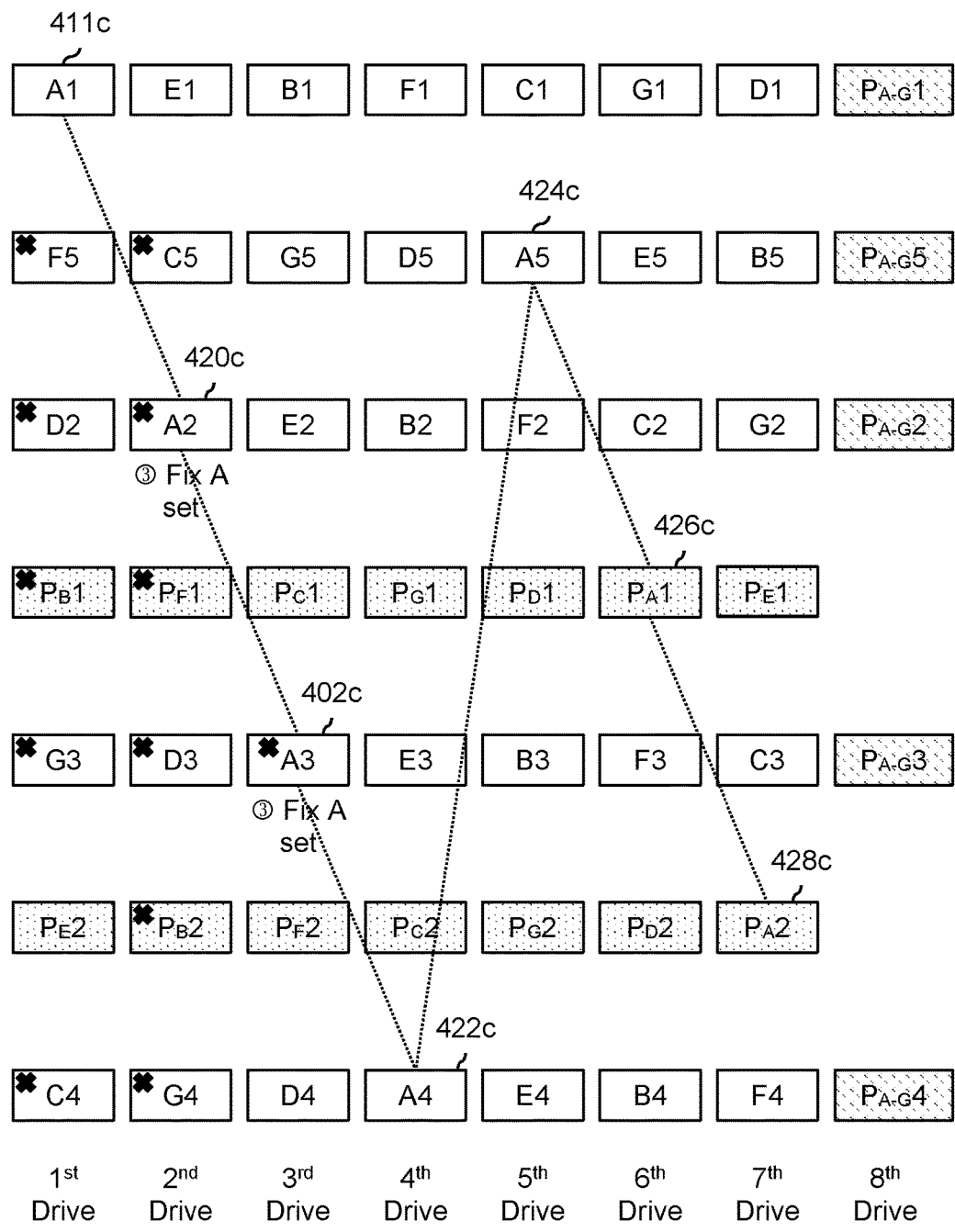
FIG. 4C is a diagram illustrating an embodiment of a third decoding pass.

FIG. 4C is a diagram illustrating an embodiment of a third decoding pass. This figure continues the example of the previous figure. Note, for example, that data A1 (411c) has been corrected and no longer has an "X" in its upper left corner. This figure also shows an example of steps 300 and 302 from FIG. 3. For example, reading the A set of data (i.e., A1 (411c), A2 (420c), A3 (402c), A4 (422c), and A5 (424c)) is an example of step 300 and performing decoding on the A set of data and corresponding A parity (i.e., $P_A1$ (426c) and $P_A2$ (428c)) is an example of step 302.

As before, the data and associated parity are obtained from the appropriate drives as needed: A1 (411c) from the first drive (this read may be skipped if A1 is still available from the previous decoding pass), A2 (420c) from the second drive, A3 (402C) from the third drive, A4 (422c) from the fourth drive, A5 (424c) from the fifth drive, parity $P_A1$ (426c) from the sixth drive, and parity $P_A2$ (428c) from the seventh drive.

Decoding is then performed on the A set of data and corresponding A set of parity information to correct A1-A5 as needed (and assuming it is within the error correction capability of the code).

Figure 4D:
FIG. 4D is a diagram illustrating an embodiment of a fourth decoding pass.
Figure 4D:
Figure 4D:
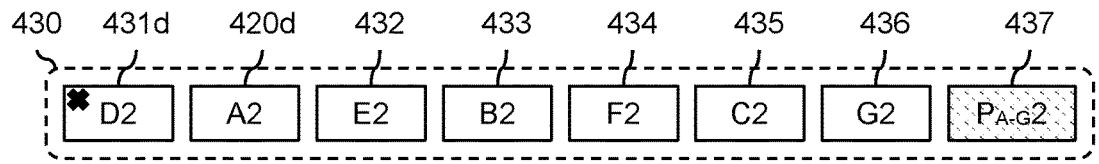
Figure 4D:
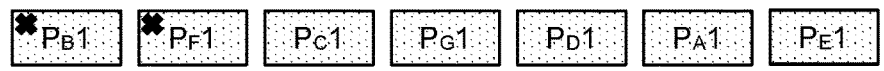
Figure 4D:
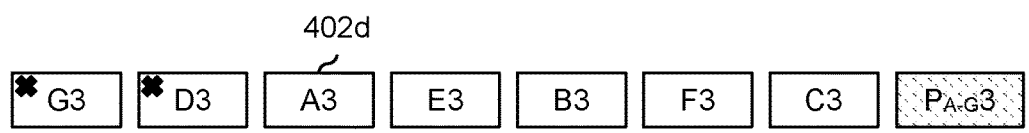
Figure 4D:
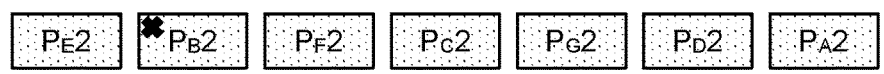
Figure 4D:

FIG. 4D is a diagram illustrating an embodiment of a fourth decoding pass. Note that data A2 (420d) and A3 (402d) have been corrected and no longer have an "X" in their upper left corner. This figure shows another example of step 304 and step 306 from FIG. 3.

The decoding pass shown here processes the third row from the top (430) and the data and parity are read from the appropriate drives as needed: data D2 (431d) from the first drive, data A2 (420) from the second drive (this read may be skipped since A2 was corrected in the previous decoding pass and may still be available), data E2 (432) from the third drive, data B2 (433) from the fourth drive, data F2 (434) from the fifth drive, data C2 (435) from the sixth drive, data G2 (436) from the seventh drive, and parity $P_{A-G}2$ (437) from the eighth drive. Since only D2 (431d) has an error, this is within the error correction capability of the second (e.g., row) code and D2 is corrected. The following figure shows the stored data with D2 corrected.

Figure 4E:
FIG. 4E is a diagram illustrating an embodiment of a storage system with errors after a fourth decoding pass is performed.
Figure 4E:
Figure 4E:
Figure 4E:
Figure 4E:
Figure 4E:
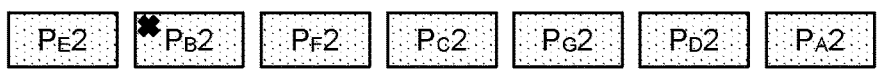
Figure 4E:
Figure 4E:
Figure 4E:
Figure 4E:

FIG. 4E is a diagram illustrating an embodiment of a storage system with errors after a fourth decoding pass is performed. Note that data D2 (431e) has been corrected and no longer has an "X" in its upper left corner.

The remaining decoding passes are not described herein since they are similar to the decoding passes described above.

The sequence of decoding passes described above is merely exemplary and other sequences may exist which result in error-free data. For example, an alternate sequence of decoding passes may be to first perform diagonal decoding on the B-G sets. Since the B-G sets each have exactly two errors, this is within the error correction capability of the first (e.g., diagonal) code. This would leave only A1-A3 with errors and since each of those blocks is located in a different row, row decoding could be performed on those rows since it is within the error correction capability of the second (e.g., row) code.

Returning to FIG. 2, in some embodiments, the first-code parity information in row 220 and row 222 are not stored in the drives. The following figures describe various examples where data is superimposed on parity information in order to increase storage capacity.

Figure 5A:
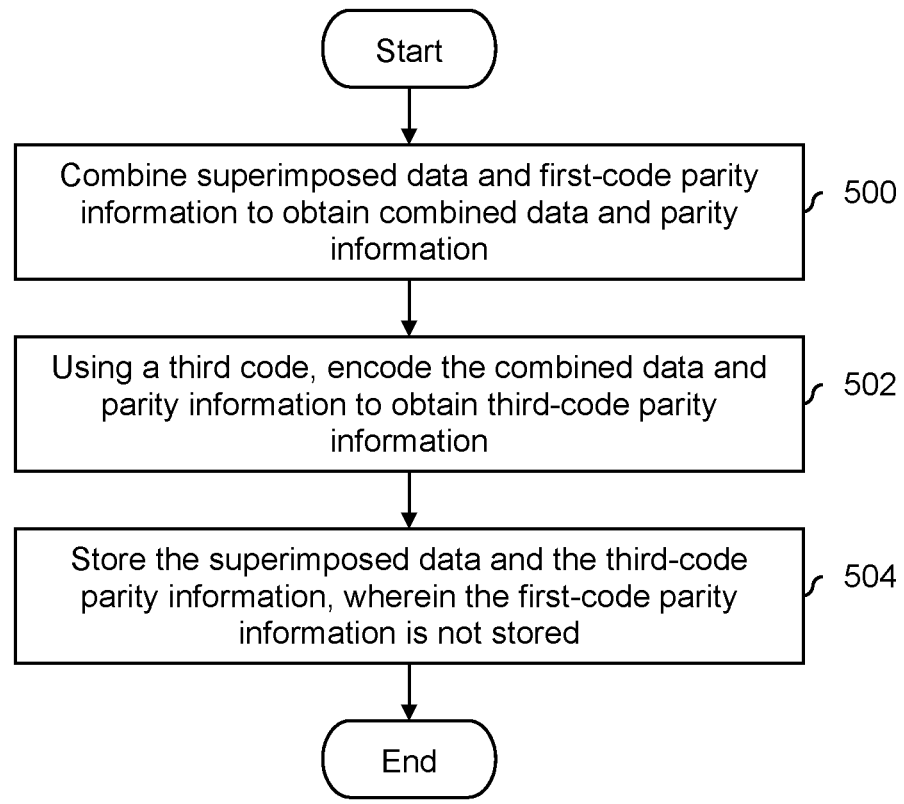
FIG. 5A is a flowchart illustrating an embodiment of a write process which includes superimposing data on parity information and use of a third code.

FIG. 5A is a flowchart illustrating an embodiment of a write process which includes superimposing data on parity information and use of a third code. The process of FIG. 5A may be performed in any combination with FIG. 1 and FIG. 5B, as desired.

At 500, superimposed data and first-code parity information are combined to obtain combined data and parity information. For example, instead of storing the first-code parity information as-is, the first-code parity information is combined with the superimposed data (e.g., to improve the storage capacity) and various downstream outputs (e.g., after various processing) are stored in place of the first-code parity information. This way, additional data is stored without completely losing the first-code parity information; this additional data is referred to herein as superimposed data. In some embodiments, the combination at step 500 is performed by performing by adding (e.g., performing a binary exclusive OR (XOR)) on the two inputs.

At 502, using a third code, the combined data and parity information is encoded to obtain third-code parity information. As will be shown below, in some embodiments, the code rate is selected based on the amount of data to protect (e.g., want to protect seven blocks) and a desired amount of parity (e.g., given available space to store the parity in).

At 504, the superimposed data and the third-code parity information are stored, wherein the first-code parity information is not stored. The stored superimposed data may replace parity-only blocks, thus improving the storage capacity. It is noted that the superimposed data being stored here does not correspond to the third-code parity information being stored here (e.g., since the third-code parity information was generated from the combined data and parity information, not the superimposed data).

Figure 5B:
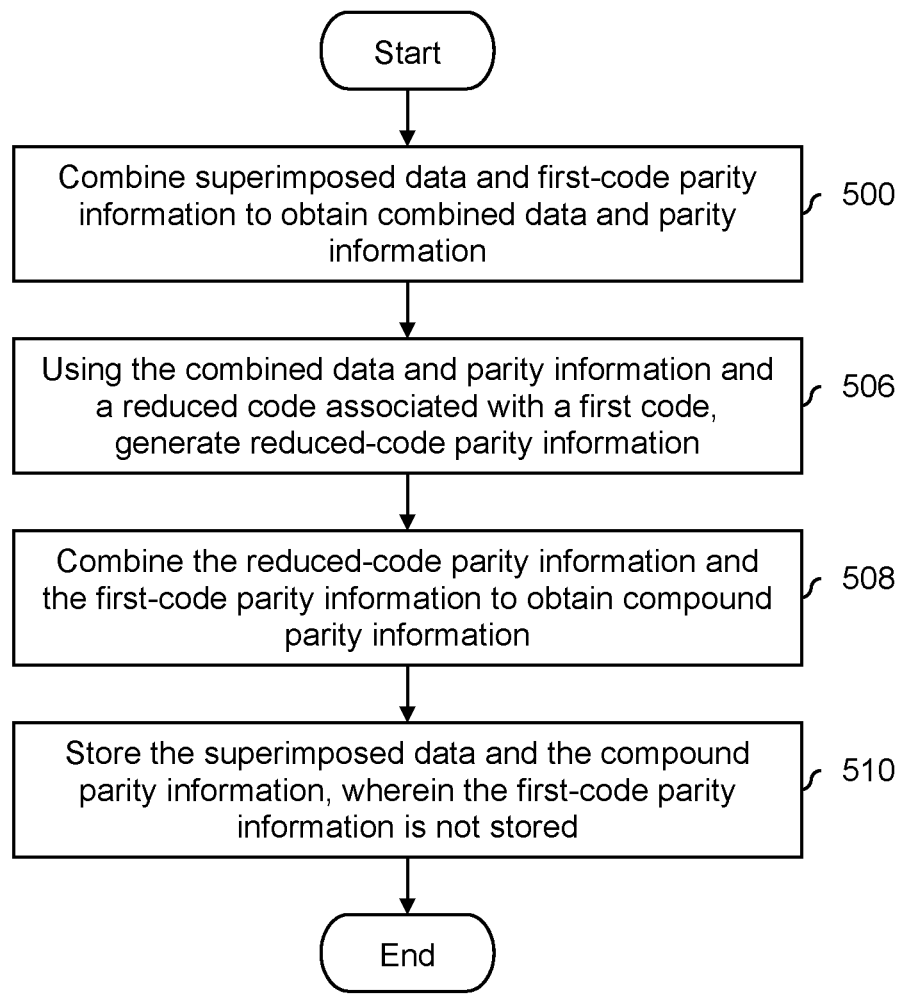
FIG. 5B is a flowchart illustrating an embodiment of a write process which includes superimposing data on parity information and use of a reduced code which is related to a first code.

FIG. 5B is a flowchart illustrating an embodiment of a write process which includes superimposing data on parity information and use of a reduced code which is related to a first code. As described above, the process of FIG. 5B may be performed in any combination with FIG. 1 and FIG. 5A, as desired.

At 500, superimposed data and first-code parity information are combined to obtain combined data and parity information. This is the same step as in FIG. 5A and therefore the same reference number is used.

At 506, using the combined data and parity information and a reduced code associated with a first code, reduced-code parity information is generated. As will be described in more detail below, in some embodiments the reduced code and first code are both linear block codes and the parity check matrix for the reduced code is obtained by removing rows from the parity check matrix for the first code. In some embodiments, step 506 includes performing zero padding on the combined data and parity information and then encoding the zero padded result using the reduced code.

At 508, the reduced-code parity information and the first-code parity information are combined to obtain compound parity information. For example, an addition (e.g., a binary XOR) may be performed. As will be described in more detail below, the compound parity information is associated with the reduced code (i.e., the compound parity information is reduced-code parity information) and may form a codeword of the reduced code with a first set of data (e.g., the A set of data) and the superimposed data (e.g., H6).

At 510, the superimposed data and the compound parity information are stored, wherein the first-code parity information is not stored.

The following figures illustrate some examples of FIG. 5A and FIG. 5B.

Figure 6:
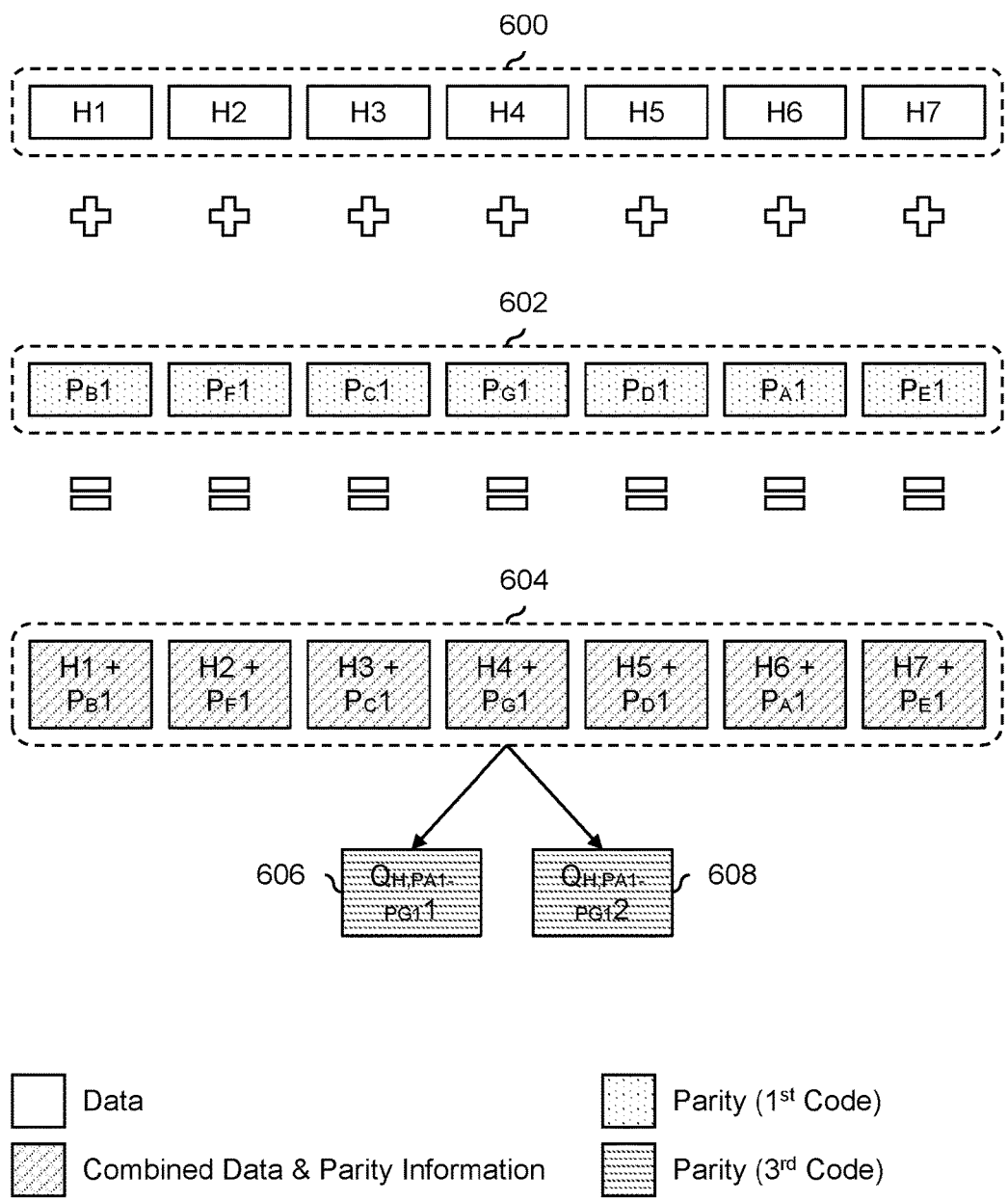
FIG. 6 is a diagram illustrating an embodiment of data which is superimposed on parity information associated with a first, diagonal code.

FIG. 6 is a diagram illustrating an embodiment of data which is superimposed on parity information associated with a first, diagonal code. In the example shown, FIG. 6 continues the example of FIG. 2. The first-code parity information shown in row 602 (i.e., $P_B1$, $P_F1$, $P_C1$, $P_G1$, $P_D1$, $P_A1$, and $P_E1$) is the same parity in row 220 in FIG. 2 and is associated with the diagonal code. Note that in FIG. 2, it is noted next to row 220 that the first-code parity information contained therein is not necessarily stored.

Returning to FIG. 6, row 600 includes data (i.e., H1-H7) which is to be superimposed onto or otherwise combined with the parity in row 600. Note that in FIG. 2 there is no H set of data (there are only A-G sets of data) and this H set of data is additional data being stored to the same set of drives to increase storage capacity. Each of the blocks of data in row 600 is an example of superimposed data (e.g., referred to in step 500 in FIG. 5A/5B).

In this example, each block of superimposed data in row 600 is combined with a corresponding block of first-code parity information by adding them together (e.g., performing a binary exclusive OR operation on the two blocks). For example, $H_1$ added to (XORed with) $P_B1$, $H_2$ is XORed added to (XORed with) $P_F1$, and so on. This produces a row of combined data and parity information (604) and each block in row 604 is an example of combined data and parity information (e.g., produced at step 500 in FIG. 5A/5B).

The blocks of combined data and parity information in row 604 are then encoded using third code to produce parity $Q_{H,P\_A1\text{-}PG1}1$ (606) and $Q_{H,PA1\text{-}PG1}2$ (608). The third code has a code rate which generates two blocks of parity information from seven input blocks. To indicate that this parity information is generated from combined data and parity information as opposed to just data, a Q is used to identify this type of parity instead of a P. Similarly, note that the subscript indicates that the parity comes from the H set of (superimposed) data as well as the parity $P_A1$-$P_G1$. Parity $Q_{H,PA1\text{-}PG1}1$ (606) and $Q_{H,PA1\text{-}PG1}2$ (608) are examples of third-code parity information for combined data and parity information which is generated at step 502 in FIG. 5A.

The following figure continues the example of this figure.

Figure 7:
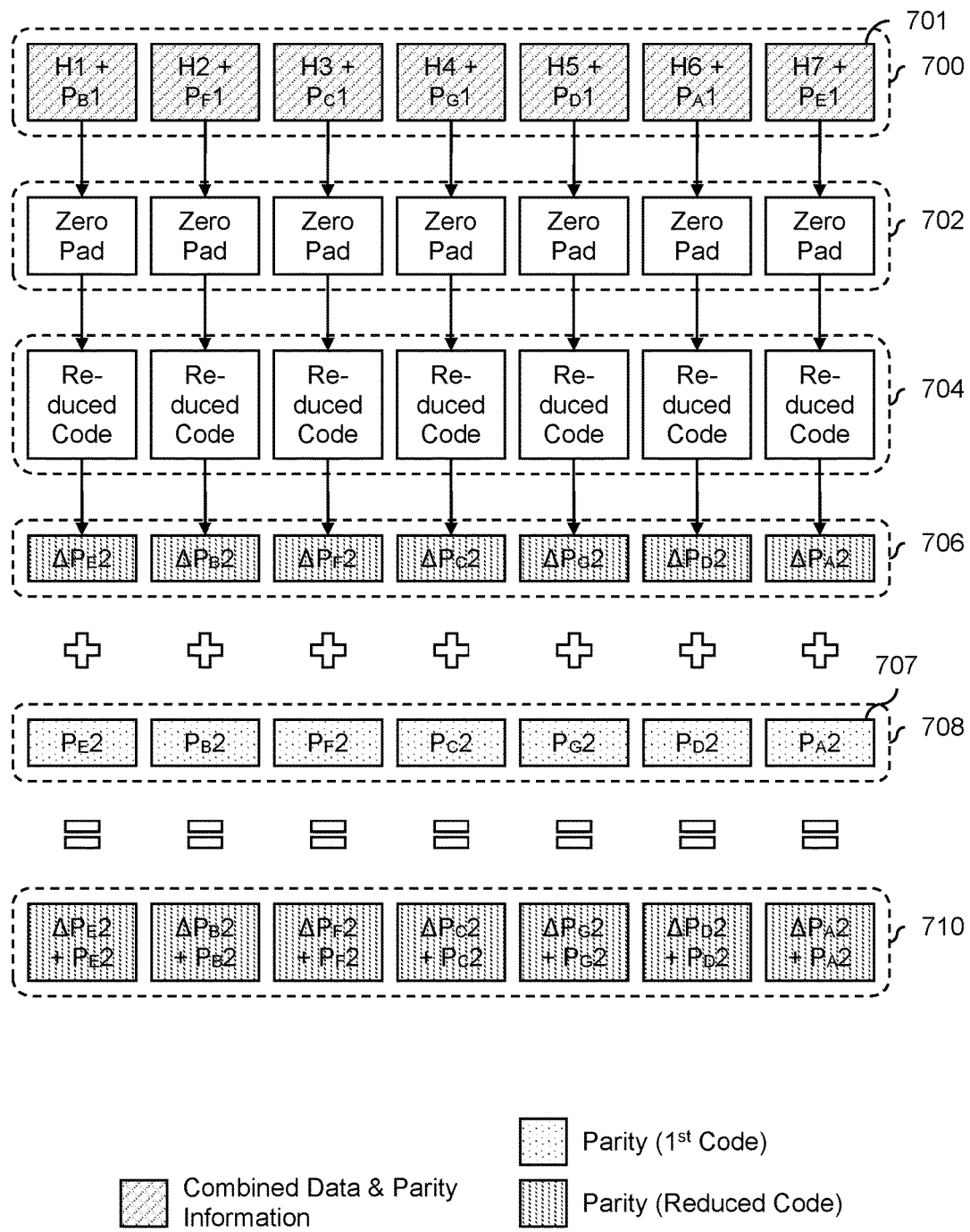
FIG. 7 is a diagram illustrating an embodiment of combined data and parity information which is encoding using a reduced code.

FIG. 7 is a diagram illustrating an embodiment of combined data and parity information which is encoding using a reduced code. In this example, row 700 (which contains blocks of combined data and parity information) is the same row as row 604 in FIG. 6.

The row of combined data and parity information (700) is zero padded to produce a row of zero-padded combined data and parity information (702). Each block of zero-padded combined data and parity information in row (702) is then encoded using the reduced code (704) to produce a row of reduced-code parity information (706) associated with the combined data and parity information. In some embodiments, generating reduced-code parity information at step 506 in FIG. 5B includes zero padding and encoding using the reduced code as shown at 702 and 704, respectively.

In some embodiments, the reduced code is a linear block code which is formed by removing parts of the parity check matrix associated with the first, diagonal code. In some embodiments, zero padding is performed so that the superimposed data is properly aligned with a correct or proper part of the parity check matrix. An example of this is described in more detail below.

The reduced-code parity information in row 706 is sometimes referred to as a parity difference or parity delta (e.g., note that the blocks in row 706 are shown as $\Delta P$). This is because each block of reduced-code parity information in row 706 is combined with and/or added to a corresponding block of first-code parity information in row 708. For example, $\Delta P_E2$ (which comes from combined data and parity information $H_1+P_B1$) is added to $P_E2$, $\Delta P_B2$ (which comes from combined data and parity information $H_2+P_F1$) is added to $P_B2$, and so on. In some embodiments, combining at step 508 in FIG. 5 includes performing an addition as shown here. The blocks of compound parity information in row (710) show examples of compound parity information generated at step 508 in FIG. 5B.

It is noted that row 706 is shaded to indicate that it is reduced-code parity information, row 708 is shaded to indicate that it is first-code parity information, and row 710 is shaded to indicate that it is reduced-code parity information. In other words, adding first-code parity information and reduced-code parity information produces reduced-code parity information. This is proven and discussed in more detail below.

The following figure continues the example of this figure and shows an example of what is stored on the various drives.

Figure 8:
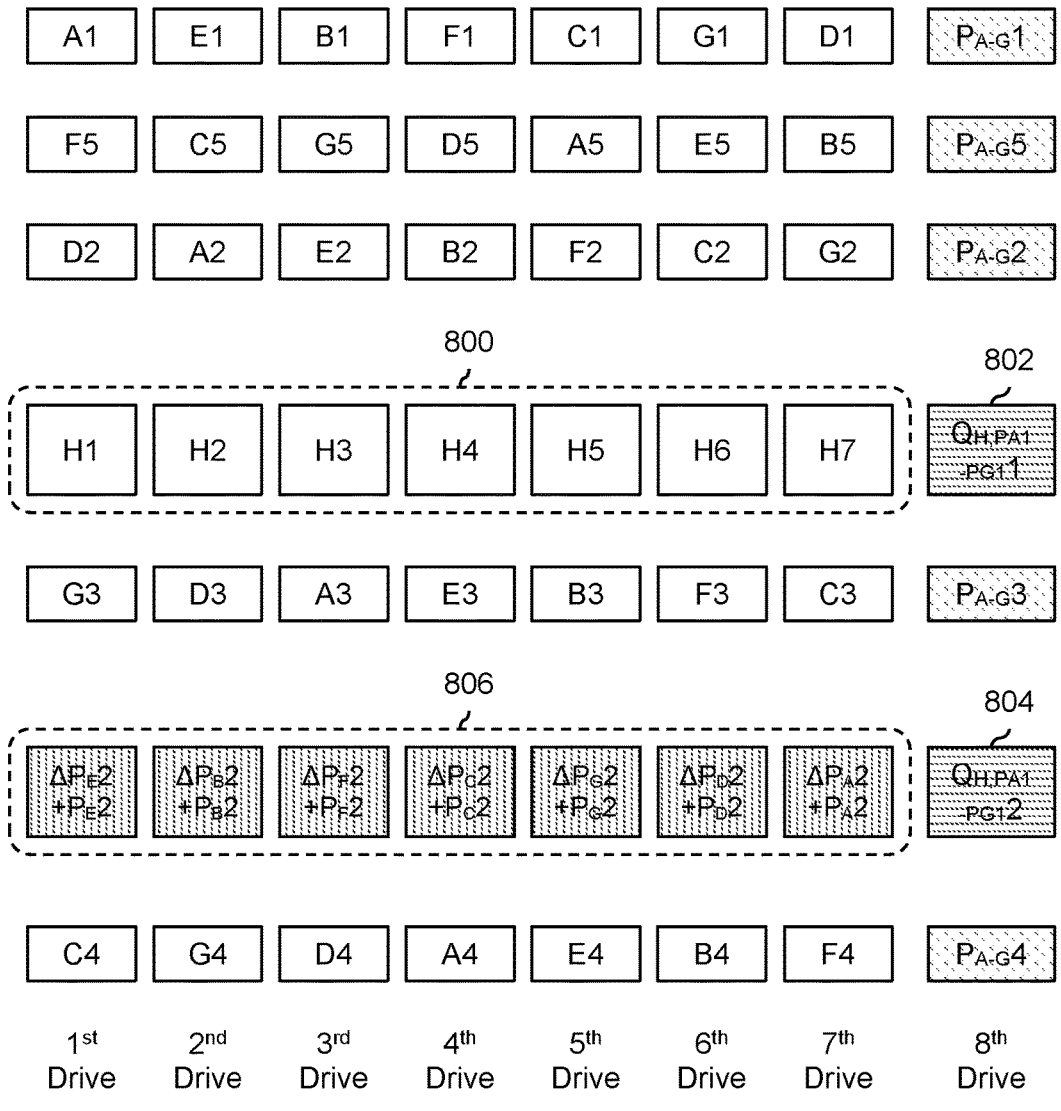
FIG. 8 is a diagram illustrating an embodiment of stored data and parity information where data is superimposed on parity information and a reduced code is used.

FIG. 8 is a diagram illustrating an embodiment of stored data and parity information where data is superimposed on parity information and a reduced code is used. Superimposed data H1-H7 (800) are stored respectively on the first-seventh drives and are the same blocks as in row 600 in FIG. 6. As before, data blocks in the same column are stored on the same drive. This shows one example of storing superimposed data at step 504 in FIG. 5A or step 510 in FIG. 5B.

Other blocks which are stored include $Q_{H,PA1\text{-}PG1}1$ (802) and $Q_{H,PA1\text{-}PG1}2$ (804), both on the eighth drive. Blocks 802 and 804 are the same blocks as parity 606 and 608 in FIG. 6. These blocks show an example of storing third-code parity information for the combined data and parity information at step 504 in FIG. 5A.

Also stored is the compound parity information (806). This includes $\Delta P_E2+P_E2$ on a first drive, $\Delta P_B2+P_B2$ on a second drive, $\Delta P_F2+P_F2$ on a third drive, $\Delta P_C2+P_C2$ on a fourth drive, $\Delta P_G2+P_G2$ on a fifth drive, $\Delta P_D2+P_D2$ on a sixth drive, and $\Delta P_A2+P_A2$ on a seventh drive. This is example of storing compound parity information at step 510 in FIG. 5B.

Note that the data and parity information described above (i.e., 800, 802, 804, and 806) occupy the fourth row and the sixth row. To improve storage capacity, the first-code parity information 220 and 222 in FIG. 2 (which similarly occupies the fourth row and sixth row) is not stored on the drives here and superimposed data 800 and parity information 802, 804, and 806 are stored instead.

The following figure shows an example of parity check matrices associated with a first, diagonal code and a related reduced code.

Figure 9:
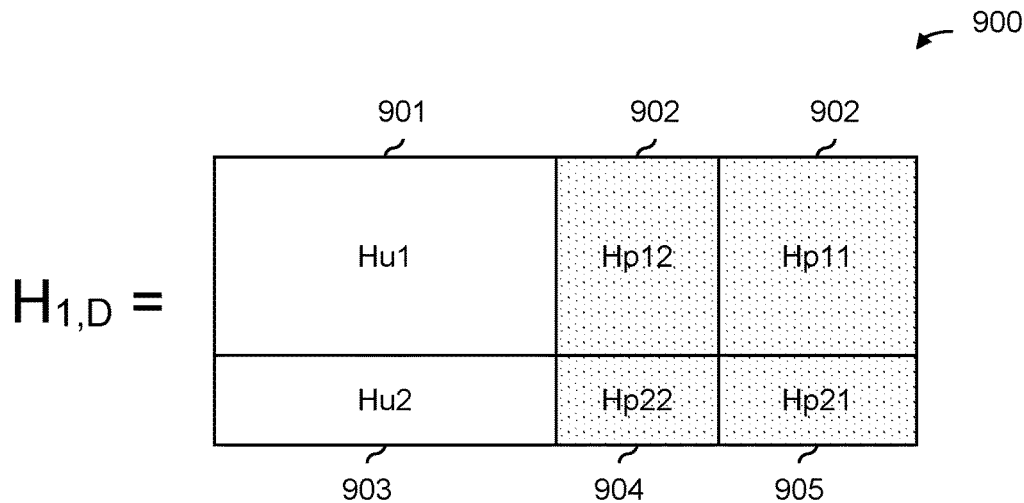
FIG. 9 is a diagram illustrating an embodiment of a parity check matrix which is associated with a first, diagonal code and a parity check matrix which is associated with a related reduced code.
Figure 9:
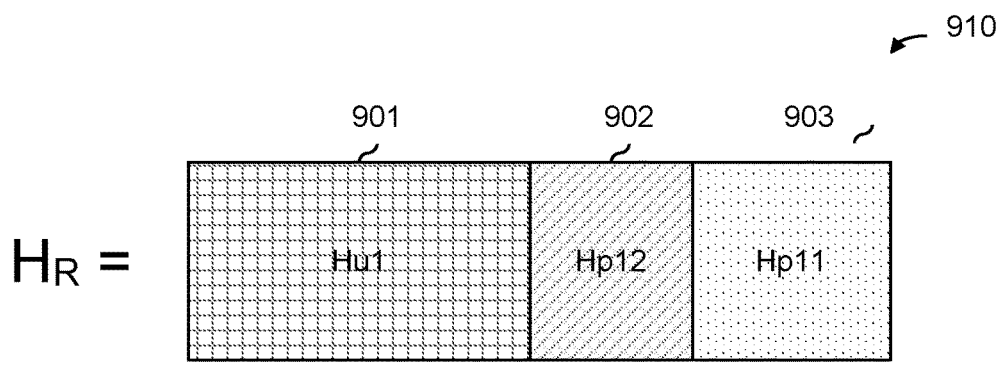
Figure 9:
Figure 9:
Figure 9:
Figure 9:

FIG. 9 is a diagram illustrating an embodiment of a parity check matrix which is associated with a first, diagonal code and a parity check matrix which is associated with a related reduced code. In the example shown, the associated codes are linear block codes. The corresponding generator matrices (e.g., G) which are used during the encoding process and which correspond to the parity check matrices shown here are not shown but can be determined.

Diagram 900 shows the parity check matrix which is associated with a first, diagonal code and includes submatrices Hu1 (901), Hp12 (902), Hp11 (902), Hu2 (903), Hp22 (904), and Hp21 (905). To be a codeword of the first, diagonal code, a codeword (e.g., when there are no errors in the codeword) must satisfy the following equation:

$$\begin{bmatrix} Hu1 & Hp12 & Hp11 \\ Hu2 & Hp22 & Hp21 \end{bmatrix} \cdot [u\ p1\ p2] = 0 \qquad (0)$$

That is, the codeword (i.e., [u p1 p2] where u is the data being protected and p1 and p2 are parity) must produce a 0 when combined with the relevant parity check matrix (i.e., $$\begin{bmatrix} Hu1 & Hp12 & Hp11 \\ Hu2 & Hp22 & Hp21 \end{bmatrix}).$$

In diagram 900, shading is used to indicate what parts of the codeword a particular sub-matrix is combined with. Looking at Equation (0), it is noted that Hu1 (901) and Hu2 (903) combine with the data (i.e., u) and Hp12 (902), Hp11 (902), Hp22 (904), and Hp21 (905) combine with the parity information (i.e., p1 or p2).

Returning to Equation (0), note that the following equations can be obtained from Equation (0):

$$[Hu1\ Hp12\ Hp11] \cdot [u\ p1\ p2] = 0 \qquad (1)$$

$$[Hu2\ Hp22\ Hp21] \cdot [u\ p1\ p2] = 0 \qquad (2)$$

Diagram 910 shows the parity check matrix for a reduced code which is related to the first code. The parity check matrix shown here is the same as in diagram 900, except the sub-matrices on the bottom have been removed. Suppose there is codeword [0 (p1+u') p2'] for the reduced code where (p1+u') is combined data and parity information and p2' is reduced-code parity information. For [0 (p1+p2')] to be a codeword of the reduced code, the following holds:

$$[Hu1\ Hp12\ Hp11] \cdot [0(p1+u')p2'] = 0 \qquad (3)$$

As before, shading is used in diagram 910 to indicate what parts of the codeword a particular sub-matrix is combined with. Looking at Equation (3), it can be determined that Hu1 (901) combines with the zero pad, Hp12 (902) combines with the combined data and parity information (i.e., p1+u') and Hp11 (903) combines with parity (i.e., p2').

Adding Equation (1) and Equation (3) produces:

$$[Hu1\ Hp12\ Hp11] \cdot [u(p1+p1+u')(p2+p2')]^T = 0$$

$$[Hu1\ Hp12\ Hp11] \cdot [u\ u'(p2+p2')]^T = 0 \qquad (4)$$

where the two copies of p1 cancel each other out.

What Equation (4) shows is that [u u' (p2+p2')] is a codeword of the reduced code where the sequence comprising u (i.e., non-superimposed data) followed by u' (i.e., superimposed data) is protected by the compound parity of (p2+p2'). This proves that the compound parity (i.e., the sum of first-code parity and reduced-code parity) produces reduced-code parity.

The following figures describe various read/decoding examples which correspond to the write/encoding examples described above.

Figure 10A:
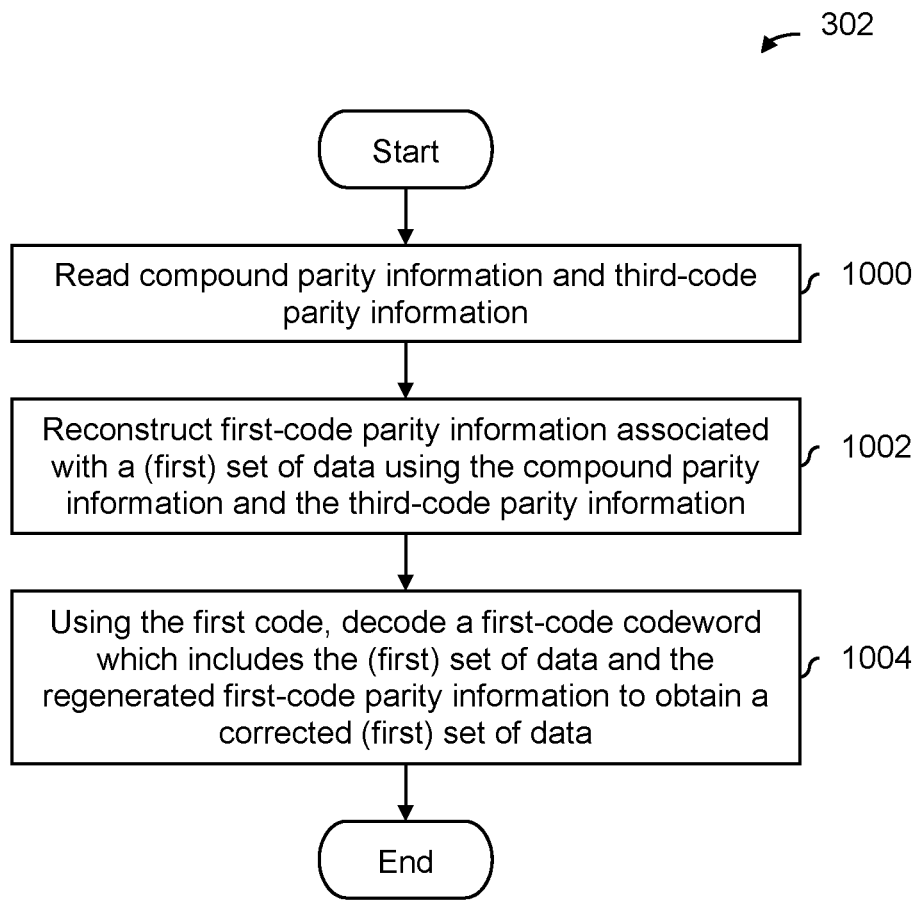
FIG. 10A is a flowchart illustrating an embodiment of a read process associated with superimposing data on parity information and use of a third code.

FIG. 10A is a flowchart illustrating an embodiment of a read process associated with superimposing data on parity information and use of a third code. FIG. 10A is a read process which corresponds to the write process of FIG. 5A. In some embodiments, FIG. 10A is performed in combination with FIG. 3, for example by using FIG. 10A at step 302 in FIG. 3. In this example, first-code parity information is reconstructed in order to perform error correction decoding using the first code. For example, the first code may be strongest code which can correct the most errors.

At 1000, compound parity information and third-code parity information are read.

At 1002, first-code parity information associated with a (first) set of data is regenerated using the compound parity information and the third-code parity information. An example of this is described in more detail below.

At 1004, using the first code, a first-code codeword which includes the (first) set of data and the regenerated first-code parity information is decoded to obtain a corrected (first) set of data. In some cases, previous decoding passes or iterations (e.g., using the reduced code or row code) may have corrected some blocks of data in the set of data. If available and/or desired, the set of data (e.g., on which decoding is performed at step 1004) may include corrected blocks of data (e.g., corrected using some code other than the first code).

Figure 10B:
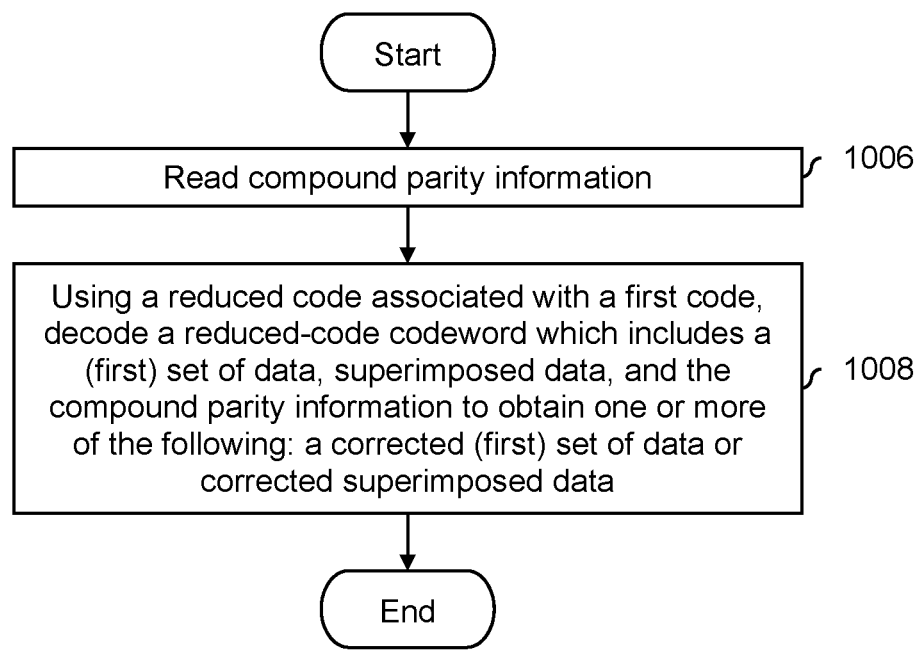
FIG. 10B is a flowchart illustrating an embodiment of a read process associated with superimposing data on parity information and use of a reduced code.

FIG. 10B is a flowchart illustrating an embodiment of a read process associated with superimposing data on parity information and use of a reduced code. FIG. 10B is a read process which corresponds to the write process of FIG. 5B. In this example, the reduced code is used to correct the set of data and/or the superimposed data (e.g., if within the error correction capability of the reduced code).

At 1006, compound parity information is read. In some examples described below, the reduced code is weaker than the first code but is faster to decode because the reduced-code parity information (i.e., the compound parity information) was stored on the drive(s) and therefore does not need to be reconstructed like the first-code parity information.

At 1008, using a reduced code associated with a first code, a reduced-code codeword which includes a (first) set of data, superimposed data, and the compound parity information is decoded to obtain one or more of the following: a corrected (first) set of data or corrected superimposed data. The set of data and superimposed data which are input to the decoder may comprise any combination of read (e.g., uncorrected) blocks and error corrected blocks. For example, a previous decoding pass or iteration may have resulted in one of the blocks being corrected and that error corrected version of the block is used. The protected information in this case includes both the set of data (e.g., the A set of data) and superimposed data (e.g., H6) and therefore one or both may be corrected by the decoder.

The following figures show some decoding examples.

Figure 11:
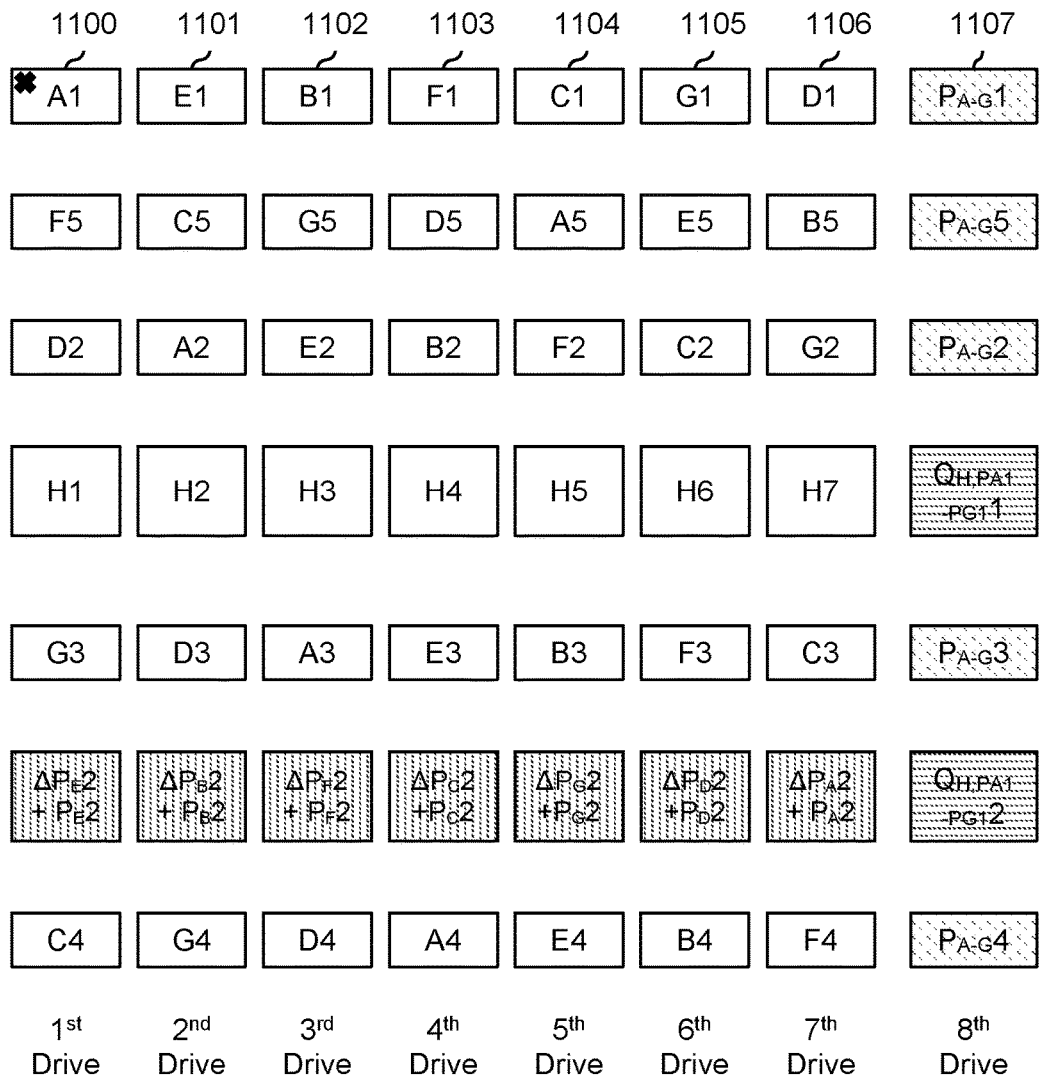
FIG. 11 is a diagram illustrating an embodiment of an error scenario where a second, row code is used to correct an error.

FIG. 11 is a diagram illustrating an embodiment of an error scenario where a second, row code is used to correct an error. This is the same row decoding described in FIG. 4B and FIG. 4D but is included here to show that row decoding is still supported (e.g., even with the superimposed data). In this example, data A1 (1100) includes an error. The top row (comprising data A1 with an error (1100), data E1 (1101), data B1 (1102), data F1 (1103), data C1 (1104), data G1 (1105), data D1 (1106), and parity $P_{A-G}1$ (1107) would be read from storage (as/if needed) and decoding using the second, row code would be performed. Reading may be skipped if a given block is already available in memory and error correction versions of any block may be used if available. The row decoding would remove the error in A1 since it is within the error correction capability of the row code.

Figure 12:
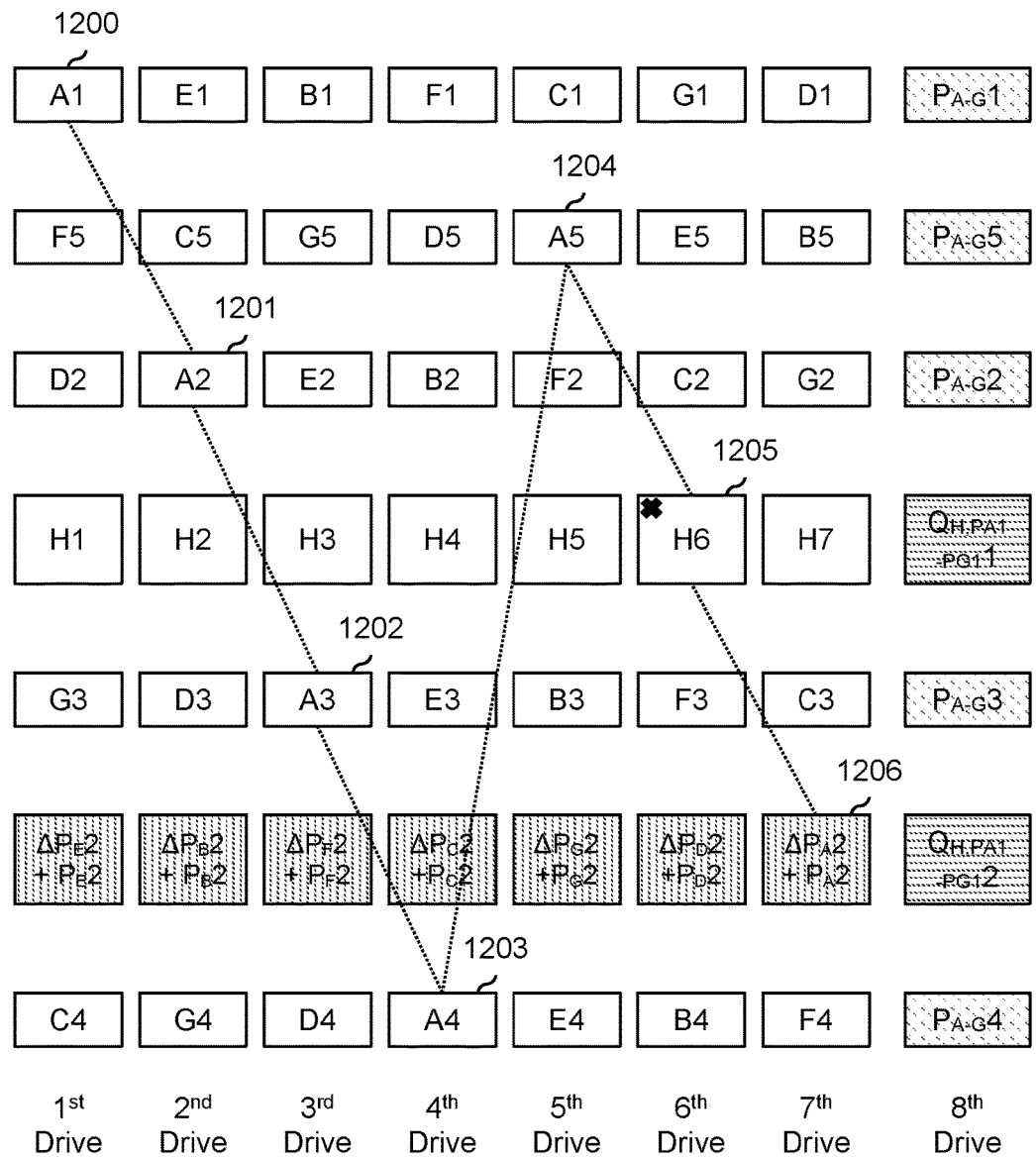
FIG. 12 is a diagram illustrating an embodiment of an error scenario where a reduced code is used to correct the error.

FIG. 12 is a diagram illustrating an embodiment of an error scenario where a reduced code is used to correct the error. This figure shows an example of the process of FIG. 10B. In this example, superimposed data H6 (1205) has an error. To remove the error, the reduced-code codeword (connected by a dotted line) comprising A1 (1200), A2 (1201), A3 (1202), A4 (1203), A5 (1204), H6 (1205), and compound parity $\Delta P_A 2 + P_A 2$ (1206) is error corrected using the reduced code. This removes the error in H6 (1205). If available, error corrected versions of any of the blocks may be used and reads may be skipped if a given block is already available (e.g., in processor memory).

Figure 13A:
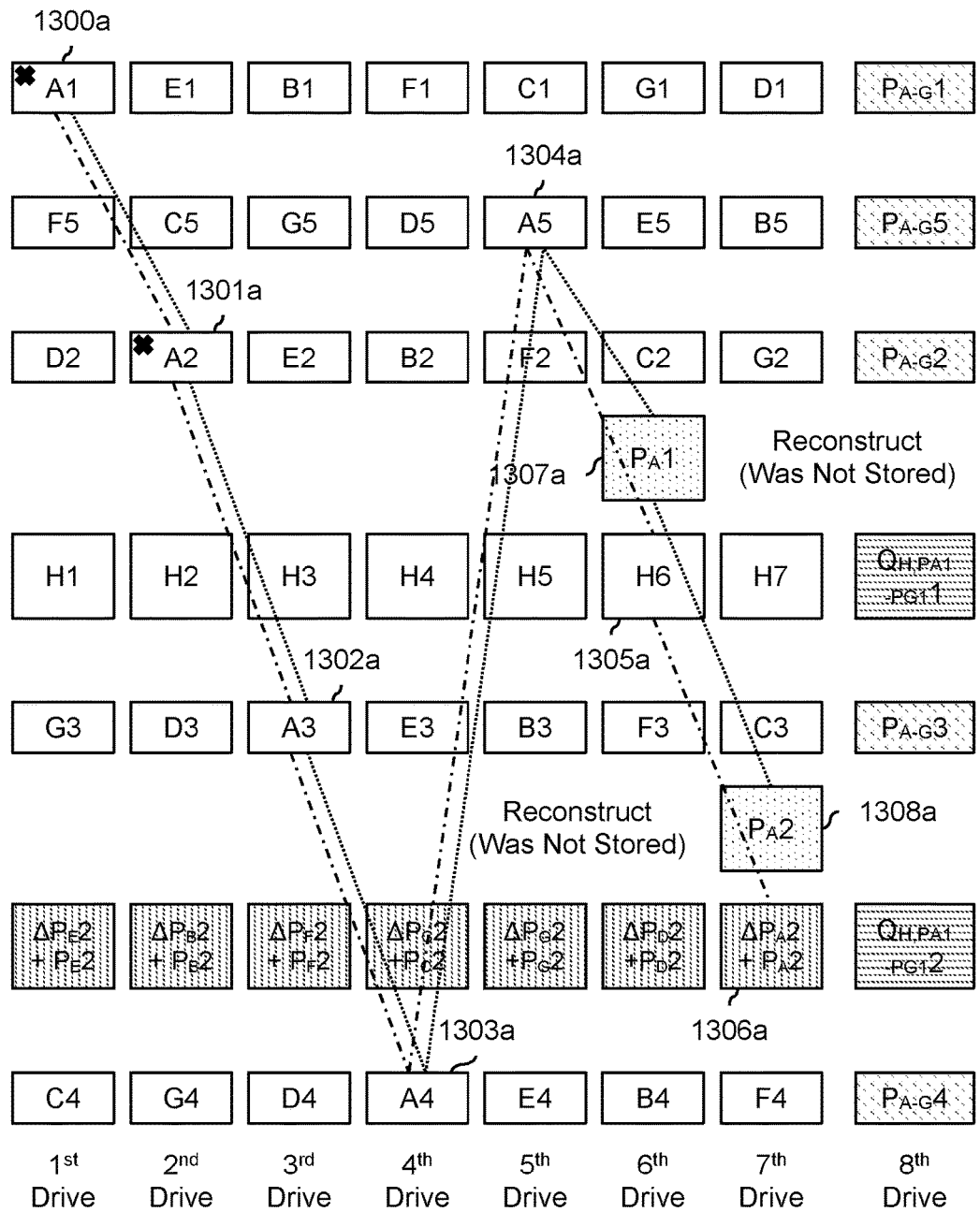
FIG. 13A is a diagram illustrating an embodiment of an error scenario where first-code parity information is reconstructed in order to perform decoding using the first code.

FIG. 13A is a diagram illustrating an embodiment of an error scenario where first-code parity information is reconstructed in order to perform decoding using the first code. This figure shows an example of the process of FIG. 10A. In the example shown, some top-level decoding process may have iterated through other codes (e.g., the row code and reduced code) and those codes have removed all the errors that are within their error correction capabilities. For example, with respect to the row code, each row may have two or more errors, which is outside of that code's error correction capability. Similarly, with respect to the reduced code, each codeword may have two or more errors, which is outside of that code's error correction capability. See, for example, the codeword associated with the reduced code comprising A1 (1300a), A2 (1302a), A3 (1304a), A4 (1305a), A5 (1305a), H6 (1305a), and $\Delta P_A 2 + P_A 2$ (1306a), shown with a dashed and dotted line. Since there are two errors (at A1 (1300a) and A2 (1301a)), the reduced code is unable to correct those errors since it can only correct at most one error.

In this example, the strongest code is the first code, which is capable of correcting two errors, but first-code parity information was not stored. To use the first code and correct the errors shown, first-code parity information $P_A 1$ (1307) and $P_A 1$ (1308) will be reconstructed in the following figures. Note, for example, the codeword associated with the first code, comprising A1 (1300a)-A5 (1305a), $P_A 1$ (1307a), and $P_A 2$ (1308a), shown with a dotted line. The first-code parity information $P_A 1$ (1307a) and $P_A 1$ (1308a) will be reconstructed in the following figures and used to correct A1 (1300a) and A2 (1302a) using the first code.

Figure 13B:
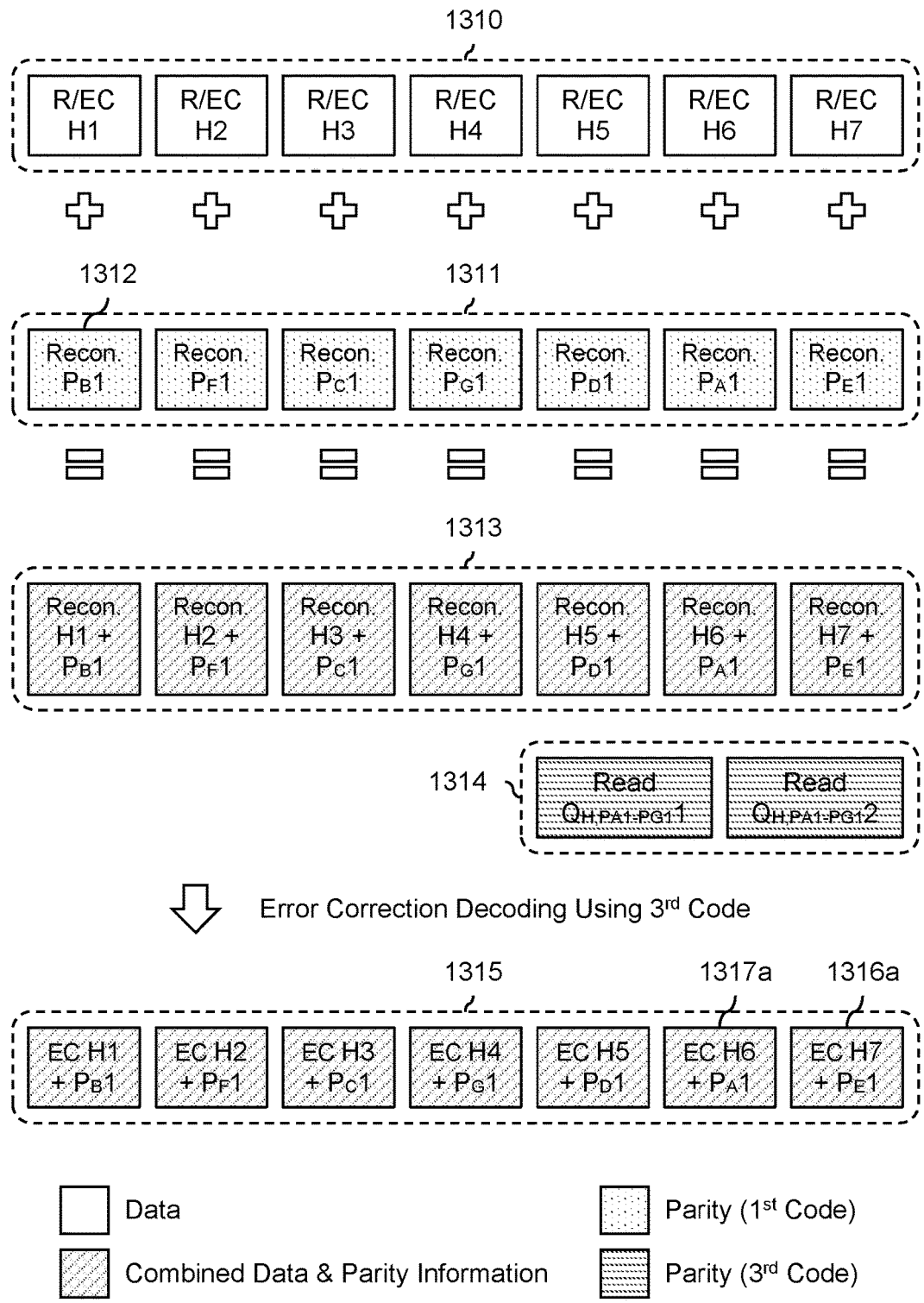
FIG. 13B is a diagram illustrating an embodiment of data and parity information associated a first part of a process to reconstruct first-code parity information which was not stored.

FIG. 13B is a diagram illustrating an embodiment of data and parity information associated a first part of a process to reconstruct first-code parity information which was not stored. It is noted that FIG. 13B shows the read/decoding processing which corresponds to the write/encoding example of FIG. 6.

In the example shown, row 1310 includes some combination of read (R) or error corrected (EC) superimposed data (e.g., the H set of data). For example, to save time, a decoding process may begin with all uncorrected H data (e.g., what was read from storage, without performing any error correction decoding). If decoding fails, then the process may begin the more time-consuming and processing-intensive process of corrected whatever H data is able to be corrected (e.g., using the reduced code and/or the row code). Those H blocks which are able to be error corrected use the error correction version, and those H blocks which are not able to be error corrected use the read version.

The row of superimposed data (1310) is added to a row of reconstructed first-block, first-code parity information (1311). For example, to generate reconstructed $P_B 1$ (1312) from row 1311, some combination of read or reconstructed B data may be obtained (e.g., B1-B5). If error correction B data is available (or time is willing to be spent on error correction), then an error correction version is used for a given block of data. If not, then a read-back (i.e., uncorrected) version is used for that block of data. Error correction encoding using the first code is then used to obtain reconstructed $P_B 1$ (1312). Similar processing is used to obtain the other blocks in row 1312.

Adding rows 1310 and 1311 produces a row of reconstructed, combined data and parity information (1313). A read of the drives is used to obtain third-code parity information $Q_{H,PA1\text{-}PG1}1$ and $Q_{H,PA1\text{-}PG1}2$ (1314). With reconstructed, combined data and parity information (1313) and third-code parity information (1314), error correction decoding using the third code can be performed to obtain corrected, combined data and parity information (1315).

The corrected, combined data and parity information $H7+P_E1$ (1316a) from row 1315 is used in the next figure to regenerate $P_A2$. Note, for example, in FIG. 7 that combined data and parity information $H7+P_E1$ (701) is in the same column as $P_A2$ (707), which is one of the parity blocks being reconstructed here.

Figure 13C:
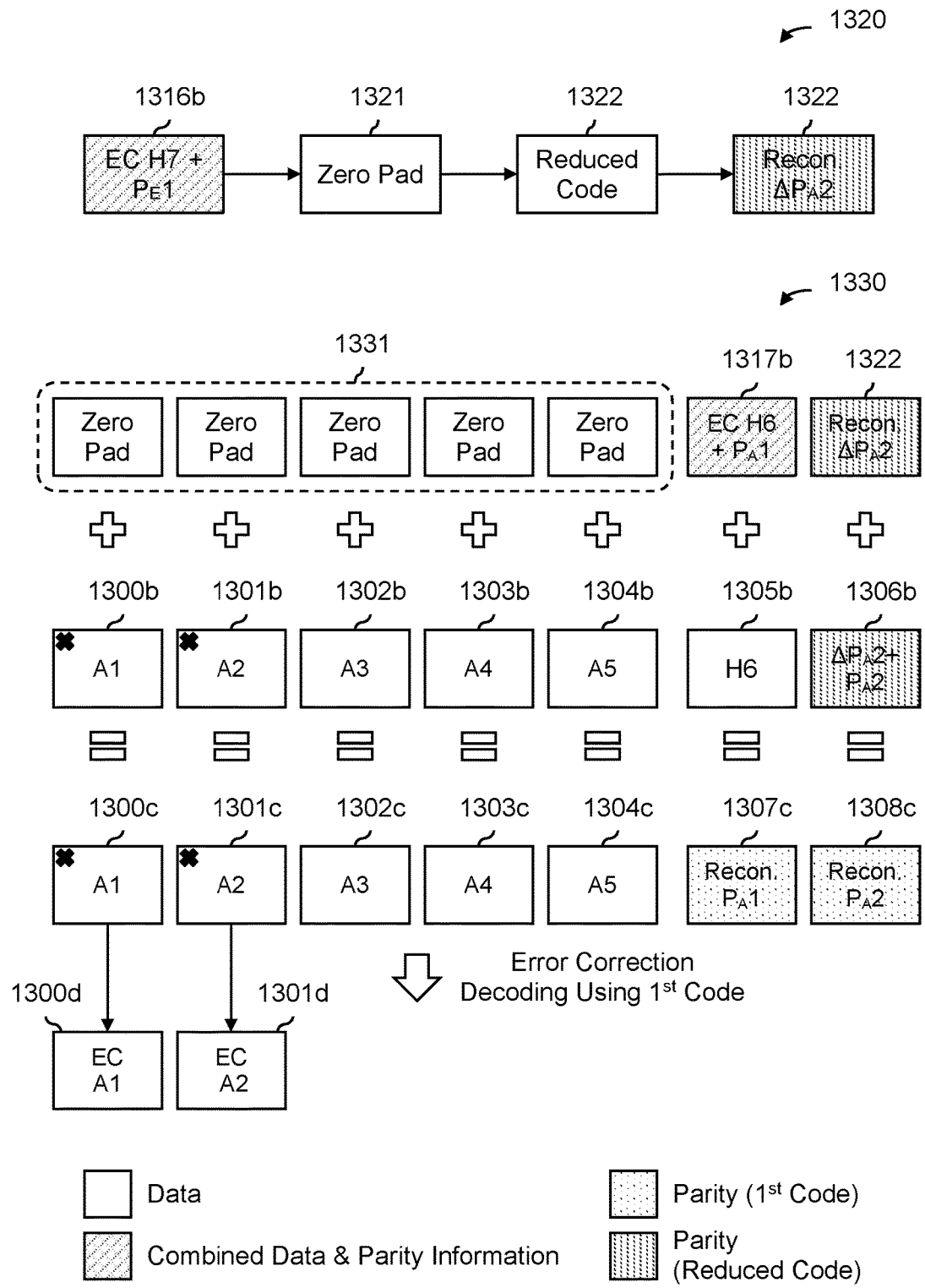
FIG. 13C is a diagram illustrating an embodiment of data and parity information associated a second part of a process to reconstruct first-code parity information which was not stored.

FIG. 13C is a diagram illustrating an embodiment of data and parity information associated a second part of a process to reconstruct first-code parity information which was not stored. It is noted that FIG. 13C shows read/decoding processing which corresponds to at least some of the write/encoding example of FIG. 7.

In diagram 1320, error corrected $H7+P_E1$ (1316b) is zero padded (1321) and then encoded using the reduced code (1322) to obtain reconstructed $\Delta P_A2$ (1323).

Diagram 1330 shows a sum which is used to reconstruct the two blocks of first-code parity information (i.e., $P_A1$ and $P_A2$). In the first term, the first five blocks are filled with a zero pad (1331). The sixth block is the corrected, combined data and parity information $H6+P_A1$ (1317b) from FIG. 13B (shown in that figure as 1317a). The seventh block is the reconstructed $\Delta P_A2$ (1322) generated in diagram 1320.

The second term in the summation comprises A1 with error(s) (1300b), A2 with error(s) (1301b), A3 (1302b), A4 (1303b), A5 (1304b), H6 (1305b), and $\Delta P_A2+P_A2$ (1308b). Any combination of read or error corrected blocks may be used for this row (e.g., if there is already an error corrected version of a given block then it is used, or if the decoding process is willing to spend the processing resources and/or time error correction decoding any of those blocks). This row corresponds to the blocks connected by the dotted line in FIG. 13A (i.e., blocks 1300a-1304a, 1307a, and 1308a).

The two terms are summed to produce a codeword which is able to be decoded using the first code: A1 with error(s) (1300c), A2 with error(s) (1301c), A3 (1302c), A4 (1303c), A5 (1304c), a reconstructed $P_A1$ (1307c), and a reconstructed $P_A2$ (1308c). Although not shown here, any of A3 (1302c)-A5 (1304c), reconstructed $P_A1$ (1307c), and reconstructed $P_A2$ (1308c) may also contain errors or noise. Note that for the first reconstructed parity block (1307c), an error corrected version of $(H6+P_A1)$ was added to a read or error corrected version of H6, and so the two H6 terms cancel each other out, leaving behind $P_A1$ (possibly with noise or errors). For the second reconstructed parity block (1308c), the two $\Delta P_A2$ terms canceled each other out, leaving behind $P_A2$.

Error correction decoding is performed using the first code to obtain error corrected A1 (1300d) and error corrected A2 (1301d). To preserve the readability of the diagram, only A1 and A2 are shown after error correction decoding since those blocks were the only one with errors.

The following figure describes the first-code parity information reconstruction example (described above) more generally and/or formally in a flowchart.

Figure 14:
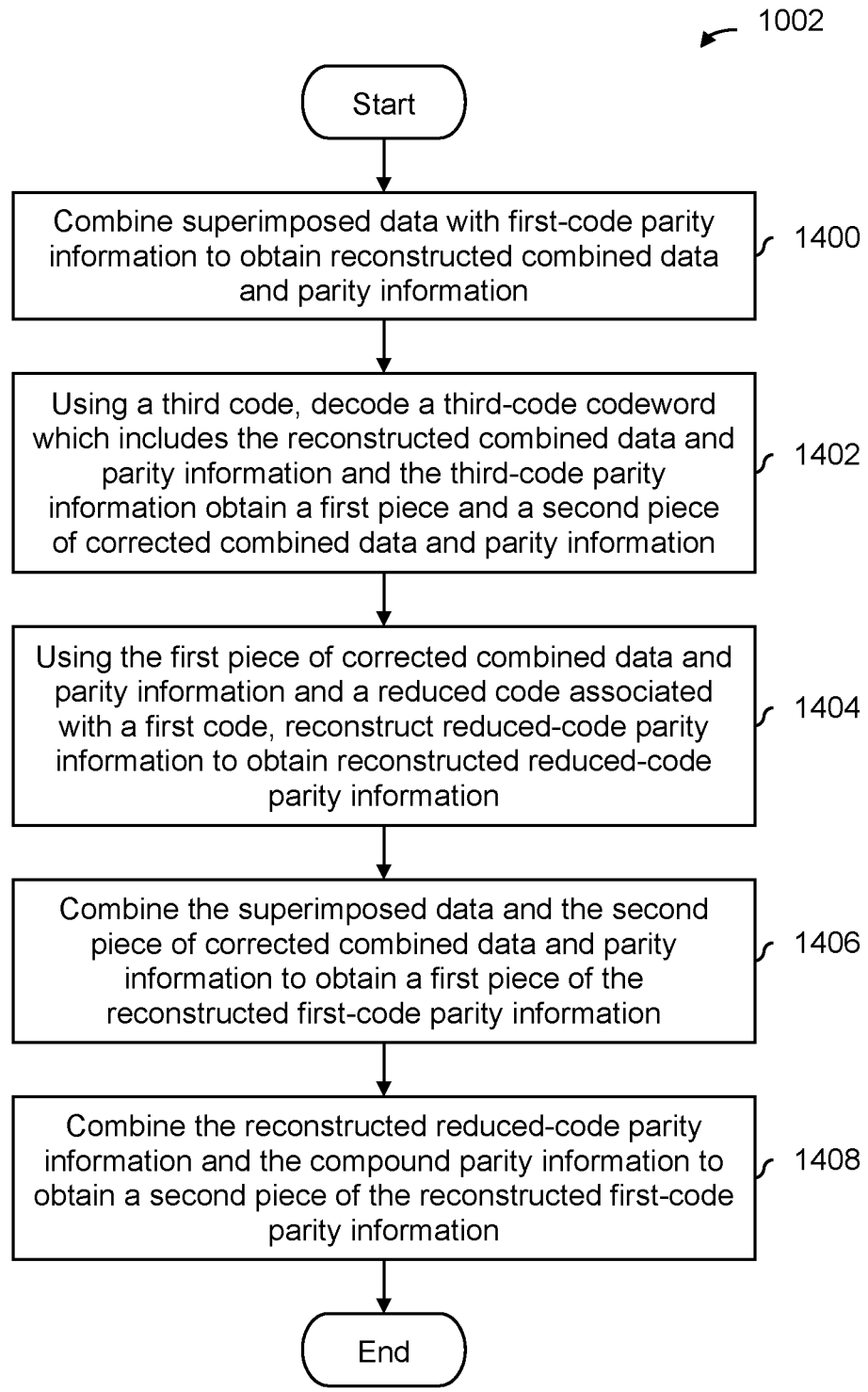
FIG. 14 is a flowchart illustrating an embodiment of a process to reconstruct first-code parity information.

FIG. 14 is a flowchart illustrating an embodiment of a process to reconstruct first-code parity information. In some embodiments, the process is used at step 1002 in FIG. 10A.

At 1400, superimposed data is combined with first-code parity information to obtain reconstructed combined data and parity information. See, for example, FIG. 13B. As described above, the superimposed data may be a read back version (e.g., uncorrected) or a corrected version. The first-code parity information may be generated by encoding the relevant set of data (e.g., comprising some combination of read back (e.g., uncorrected) blocks and/or corrected blocks).

At 1402, using a third code, a third-code codeword is decoded which includes the reconstructed combined data and parity information and the third-code parity information obtain a first piece and a second piece of corrected combined data and parity information. See, for example FIG. 13B. In that example, the reconstructed combined data and parity information comes from the previous step (e.g., step 1400 in this process) and the third-code parity information is read from the drives.

At 1404, using the first piece of corrected combined data and parity information and a reduced code associated with a first code, reduced-code parity information is reconstructed to obtain reconstructed reduced-code parity information. See, for example, diagram 1320 in FIG. 13C where a block of the corrected combined data and parity information from the previous step (e.g., step 1402 in this process) is zero padded and encoded using the reduced code.

At 1406, the superimposed data and the second piece of corrected combined data and parity information are combined to obtain a first piece of the reconstructed first-code parity information. See, for example, the addition of superimposed data H6 (1305b) and corrected combined data and parity information "EC $H6+P_A1$" (1317b) in diagram 1330 in FIG. 13C.

At 1408, the reconstructed reduced-code parity information and the compound parity information are combined to obtain a second piece of the reconstructed first-code parity information. See, for example, the addition of reconstructed reduced-code parity information "Recon. $\Delta P_A2$" (1322) and compound parity information "$\Delta P_A2+P_A2$" (1306b) in diagram 1330 in FIG. 13C.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system for storing data, comprising:
   a processor; and
   a memory coupled with the processor, wherein the memory is configured to provide the processor with instructions which when executed cause the processor to:
   encode, using a first code, a first set of data to obtain a first-code codeword which includes the first set of data and first-code parity information;
   store the first set of data on a plurality of drives, wherein the first set of data is distributed amongst the plurality of drives and the first parity information is not stored on the plurality of drives;
   encode, using a second code, a second set of data to obtain a second-code codeword which includes the second set of data and second-code parity information;
   store the second-code codeword on the plurality of drives, wherein the second set of data and second-code parity information are distributed amongst the plurality of drives;

superimpose a third set of data onto the first-code parity information to obtain combined information set, including by combining the third set of data and the first-code parity information to obtain the combined information set;
generate parity information associated with the combined information set based at least in part on the combined information set; and
store the third set of data and the parity information associated with the combined information set.

2. The system recited in claim 1, wherein:
the instructions to generate the parity information associated with the combined information set include instructions to encode, using a third code, the combined information set to obtain third-code parity information; and
the instructions to store the third set of data and the parity information associated with the combined information set include instructions to store the third set of data and the third-code parity information.

3. The system recited in claim 1, wherein:
the instructions to generate the parity information associated with the combined information set include instructions to:
generate reduced-code parity information using the combined information set and a reduced code associated with the first code; and
combine the reduced-code parity information and the first-code parity information to obtain compound parity information; and
the instructions to store the third set of data and the parity information associated with the combined information set include instructions to store the third set of data and the compound parity information.

4. The system recited in claim 1, wherein:
the instructions to generate the parity information associated with the combined information set include instructions to:
generate reduced-code parity information using the combined information set and a reduced code associated with the first code, including by:
zero padding the combined information set to obtain zero-padded combined information set; and
encoding the zero-padded combined information set using the reduced code; and
combine the reduced-code parity information and the first-code parity information to obtain compound parity information; and
the instructions to store the third set of data and the parity information associated with the combined information set include instructions to store the third set of data and the compound parity information.

5. The system recited in claim 1, wherein:
the instructions to generate the parity information associated with the combined information set include instructions to:
encode the combined information set using a third code to obtain third-code parity information;
generate reduced-code parity information using the combined information set and a reduced code associated with the first code; and
combine the reduced-code parity information and the first-code parity information to obtain compound parity information; and
the instructions to store the third set of data and the parity information associated with the combined information set include instructions to store the third set of data, the third-code parity information, and the compound parity information.

6. The system recited in claim 1, wherein:
the instructions to generate the parity information associated with the combined information set include instructions to:
encode the combined information set using a third code to obtain third-code parity information;
generate reduced-code parity information using the combined information set and a reduced code associated with the first code, including by:
zero padding the combined information set to obtain zero-padded combined information set; and
encoding the zero-padded combined information set using the reduced code; and
combine the reduced-code parity information and the first-code parity information to obtain compound parity information; and
the instructions to store the third set of data and the parity information associated with the combined information set include instructions to store the third set of data, the third-code parity information, and the compound parity information.

7. The system recited in claim 1, wherein the first set of data and the second set of data share at least one data element.

8. A system for accessing data, comprising:
a processor; and
a memory coupled with the processor, wherein the memory is configured to provide the processor with instructions which when executed cause the processor to:
read a first set of data and parity information associated with combined information set from a plurality of drives, wherein:
the first set of data is distributed amongst the plurality of drives;
first-code parity information is not stored on the plurality of drives;
a third set of data is superimposed onto the first-code parity information to obtain the combined information set, including by combining the third set of data and the first-code parity information to obtain the combined information set; and
the parity information associated with the combined information set is generated based at least in part on the combined information set;
decode, using a first code, a first-code codeword which includes the first set of data and reconstructed first-code parity information to obtain a first corrected set of data, including by reconstructing the first-code parity information using the parity information associated with the combined information set in order to obtain the reconstructed first-code parity information;
read a second-code codeword from the plurality of drives, wherein:
the second-code codeword includes a second set of data and second-code parity information; and
the second set of data and the second-code parity information are distributed amongst the plurality of drives; and
decode, using a second code, the second-code codeword which includes the second set of data and the second-code parity information to obtain a second corrected set of data.

9. The system recited in claim 8, wherein:
the parity information associated with the combined information set includes compound parity information and third-code parity information;
the instructions to read the first set of data and the parity information associated with the combined information set include instructions to read the compound parity information and the third-code parity information; and
the instructions to reconstruct the first-code parity information include instructions to reconstruct the first-code parity information associated with the first set of data using the compound parity information and the third-code parity information.

10. The system recited in claim 8, wherein:
the parity information associated with the combined information set includes compound parity information and third-code parity information;
the instructions to read the first set of data and the parity information associated with the combined information set include instructions to read the compound parity information and the third-code parity information;
the instructions to reconstruct the first-code parity information include instructions to reconstruct the first-code parity information associated with the first set of data using the compound parity information and the third-code parity information; and
the memory is further configured to provide the processor with instructions which when executed cause the processor to:
 decode, using a reduced code associated with the first code, a reduced-code codeword which includes the first set of data, the third set of data, and the compound parity information to obtain one or more of the following: the first corrected set of data or a third corrected set of data.

11. The system recited in claim 8, wherein:
the parity information associated with the combined information set includes compound parity information and third-code parity information;
the instructions to read the first set of data and the parity information associated with the combined information set include instructions to read the compound parity information and the third-code parity information;
the instructions to reconstruct the first-code parity information include instructions to reconstruct the first-code parity information associated with the first set of data using the compound parity information and the third-code parity information;
the memory is further configured to provide the processor with instructions which when executed cause the processor to:
 decode, using a reduced code associated with the first code, a reduced-code codeword which includes the first set of data, the third set of data, and the compound parity information to obtain one or more of the following: the first corrected set of data or a third corrected set of data; and
the instructions to reconstruct the first-code parity information include instructions to:
 combine the third set of data with the first-code parity information to obtain reconstructed combined information set;
 decode, using a third code, a third-code codeword which includes the reconstructed combined information set and the third-code parity information obtain a first piece and a second piece of corrected combined information set;
 reconstruct reduced-code parity information using the first piece of corrected combined information set and a reduced code associated with a first code to obtain reconstructed reduced-code parity information;
 combine the the third set of data and the second piece of corrected combined information set to obtain a first piece of the reconstructed first-code parity information; and
 combine the reconstructed reduced-code parity information and the compound parity information to obtain a second piece of the reconstructed first-code parity information.

12. A method for storing data, comprising:
encoding, using a first code, a first set of data to obtain a first-code codeword which includes the first set of data and first-code parity information;
storing the first set of data on a plurality of drives, wherein the first set of data is distributed amongst the plurality of drives and the first-code parity information is not stored on the plurality of drives;
encoding, using a second code, a second set of data to obtain a second-code codeword which includes the second set of data and second-code parity information;
storing the second-code codeword on the plurality of drives, wherein the second set of data and second-code parity information are distributed amongst the plurality of drives;
superimposing a third set of data onto the first-code parity information to obtain combined information set, including by combining the third set of data and the first-code parity information to obtain the combined information set;
generating parity information associated with the combined information set based at least in part on combined information set; and
storing the third set of data and the parity information associated with the combined information set.

13. The method recited in claim 12, wherein:
generating the parity information associated with the combined information set includes encoding, using a third code, the combined information set to obtain third-code parity information; and
storing the third set of data and the parity information associated with the combined information set includes storing the third set of data and the third-code parity information.

14. The method recited in claim 12, wherein:
generating the parity information associated with the combined information set includes:
 generating reduced-code parity information using the combined information set and a reduced code associated with the first code; and
 combining the reduced-code parity information and the first-code parity information to obtain compound parity information; and
storing the third set of data and the parity information associated with the combined information set includes storing the third set of data and the compound parity information.

15. The method recited in claim 12, wherein:
generating the parity information associated with the combined information set includes:
 generating reduced-code parity information using the combined information set and a reduced code associated with the first code, including by:
  zero padding the combined information set to obtain zero-padded combined information set; and encoding the zero-padded combined information set using the reduced code; and
combining the reduced-code parity information and the first-code parity information to obtain compound parity information; and
storing the third set of data and the parity information associated with the combined information set includes storing the third set of data and the compound parity information.

16. The method recited in claim 12, wherein:
generating the parity information associated with the combined information set includes:
encoding the combined information set using a third code to obtain third-code parity information;
generating reduced-code parity information using the combined information set and a reduced code associated with the first code; and
combining the reduced-code parity information and the first-code parity information to obtain compound parity information; and
storing the third set of data and the parity information associated with the combined information set includes storing the third set of data, the third-code parity information, and the compound parity information.

17. The method recited in claim 12, wherein:
generating the parity information associated with the combined information set includes:
encoding the combined information set using a third code to obtain third-code parity information;
generating reduced-code parity information using the combined information set and a reduced code associated with the first code, including by:
zero padding the combined information set to obtain zero-padded combined information set; and
encoding the zero-padded combined information set using the reduced code; and
combining the reduced-code parity information and the first-code parity information to obtain compound parity information; and
storing the third set of data and the parity information associated with the combined information set includes storing the third set of data, the third-code parity information, and the compound parity information.

18. A method for accessing data, comprising:
reading a first set of data and parity information associated with combined information set from a plurality of drives, wherein:
the first set of data is distributed amongst the plurality of drives;
first-code parity information is not stored on the plurality of drives;
a third set of data is superimposed onto the first-code parity information to obtain the combined information set, including by combining the third set of data and the first-code parity information to obtain the combined information set; and
the parity information associated with the combined information set is generated based at least in part on the combined information set;
decoding, using a first code, a first-code codeword which includes the first set of data and reconstructed first-code parity information to obtain a first corrected set of data, including by reconstructing the first-code parity information using the parity information associated with the combined information set in order to obtain the reconstructed first-code parity information;
reading a second-code codeword from the plurality of drives, wherein:
the second-code codeword includes a second set of data and second-code parity information; and
the second set of data and the second-code parity information are distributed amongst the plurality of drives; and
decoding, using a second code, the second-code codeword which includes the second set of data and the second-code parity information to obtain a second corrected set of data.

19. The method recited in claim 18, wherein:
the parity information associated with the combined information set includes compound parity information and third-code parity information;
reading the first set of data and the parity information associated with the combined information set includes reading the compound parity information and the third-code parity information; and
reconstructing the first-code parity information includes reconstructing the first-code parity information associated with the first set of data using the compound parity information and the third-code parity information.

20. The method recited in claim 18, wherein:
the parity information associated with the combined information set includes compound parity information and third-code parity information;
reading the first set of data and the parity information associated with the combined information set includes reading the compound parity information and the third-code parity information;
reconstructing the first-code parity information includes reconstructing the first-code parity information associated with the first set of data using the compound parity information and the third-code parity information; and
the method further includes:
decoding, using a reduced code associated with the first code, a reduced-code codeword which includes the first set of data, the third set of data, and the compound parity information to obtain one or more of the following: the first corrected set of data or a third corrected set of data.

21. The method recited in claim 18, wherein:
the parity information associated with the combined information set includes compound parity information and third-code parity information;
reading the first set of data and the parity information associated with the combined information set includes reading the compound parity information and the third-code parity information;
reconstructing the first-code parity information includes reconstructing the first-code parity information associated with the first set of data using the compound parity information and the third-code parity information;
the method further includes :
decoding, using a reduced code associated with the first code, a reduced-code codeword which includes the first set of data, the third set of data, and the compound parity information to obtain one or more of the following: the first corrected set of data or a third corrected set of data; and
reconstructing the first-code parity information includes:
combining the third set of data with the first-code parity information to obtain reconstructed combined information set;
decoding, using a third code, a third-code codeword which includes the reconstructed combined information set and the third-code parity information obtain a first piece and a second piece of corrected combined information set;

reconstructing reduced-code parity information using the first piece of corrected combined information set and a reduced code associated with a first code to obtain reconstructed reduced-code parity information;

combining the the third set of data and the second piece of corrected combined information set to obtain a first piece of the reconstructed first-code parity information; and combining the reconstructed reduced-code parity information and the compound parity information to obtain a second piece of the reconstructed first-code parity information.

\* \* \* \* \*

UNITED STATES PATENT AND TRADEMARK OFFICE
CERTIFICATE OF CORRECTION

PATENT NO. : 10,263,643 B2
APPLICATION NO. : 15/479605
DATED : April 16, 2019
INVENTOR(S) : Shu Li Page 1 of 1

It is certified that error appears in the above-identified patent and that said Letters Patent is hereby corrected as shown below:

In the Specification

In Column 12, Line 32, delete "[0 (p1+p2']" and insert --[0 (p1+u') p2']--, therefor.

In the Claims

In Column 16, Claim 1, Line 58, delete "first" and insert --first-code--, therefor.

In Column 20, Claim 14, Line 47, delete "wherein;" and insert --wherein:--, therefor.

Signed and Sealed this
Twenty-fourth Day of September, 2019

Andrei Iancu
*Director of the United States Patent and Trademark Office*